(12) United States Patent
Ohkubo

(10) Patent No.: US 6,810,055 B2
(45) Date of Patent: Oct. 26, 2004

(54) SEMICONDUCTOR LASER DEVICE AND MANUFACTURING METHOD THEREOF

(75) Inventor: Nobuhiro Ohkubo, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 211 days.

(21) Appl. No.: 09/984,000

(22) Filed: Oct. 26, 2001

(65) Prior Publication Data

US 2002/0126723 A1 Sep. 12, 2002

(30) Foreign Application Priority Data

Oct. 31, 2000 (JP) .......................................... 2000-331623
Sep. 10, 2001 (JP) .......................................... 2001-273071

(51) Int. Cl.⁷ ................................................. H01S 5/00
(52) U.S. Cl. ............................. 372/46; 372/43; 372/44
(58) Field of Search ..................................... 372/43–46

(56) References Cited

U.S. PATENT DOCUMENTS

| | | | | |
|---|---|---|---|---|
| 4,270,096 A | * | 5/1981 | Hayashi et al. ............ 331/94.5 |
| 4,337,443 A | | 6/1982 | Umeda et al. ................. 372/49 |
| 4,510,607 A | | 4/1985 | Garcia et al. .................. 372/49 |
| 4,599,729 A | | 7/1986 | Sasaki et al. .................. 372/49 |
| 5,438,585 A | * | 8/1995 | Armour et al. ................ 372/45 |
| 5,811,839 A | * | 9/1998 | Shimoyama et al. ......... 257/94 |
| 6,181,723 B1 | * | 1/2001 | Okubo et al. ................. 372/45 |
| 6,323,052 B1 | * | 11/2001 | Horie et al. ................... 438/46 |
| 6,396,864 B1 | | 5/2002 | O'Brien et al. ............... 372/49 |

FOREIGN PATENT DOCUMENTS

| | | |
|---|---|---|
| JP | 5-218593 A | 8/1993 |
| JP | 9-23037 A | 1/1997 |
| JP | 10-321945 A | 12/1998 |
| JP | 2000-323788 A | 11/2000 |
| JP | 2001-15859 | 1/2001 |
| JP | 2001-94207 A | 4/2001 |

* cited by examiner

Primary Examiner—Don Wong
Assistant Examiner—Leith A Al-Nazer
(74) Attorney, Agent, or Firm—Nixon & Vanderhye P.C.

(57) ABSTRACT

A semiconductor laser device has a quantum well active layer including a well layer and a barrier layer laminated on a semiconductor substrate. The quantum well active layer contains II group atoms such as Zn atoms. The quantum well active layer is so formed that a bandgap of the quantum well active layer in the vicinity of an end surface of a laser resonator is larger than a bandgap of the quantum well active layer inside the laser resonator. The II group atoms contained in the quantum well active layer inside the laser resonator make up for vacancies introduced therein so as to inhibit fluctuation of the bandgap of the quantum well active layer inside the laser resonator and thereby to enhance long-term reliability of the semiconductor laser device.

27 Claims, 11 Drawing Sheets

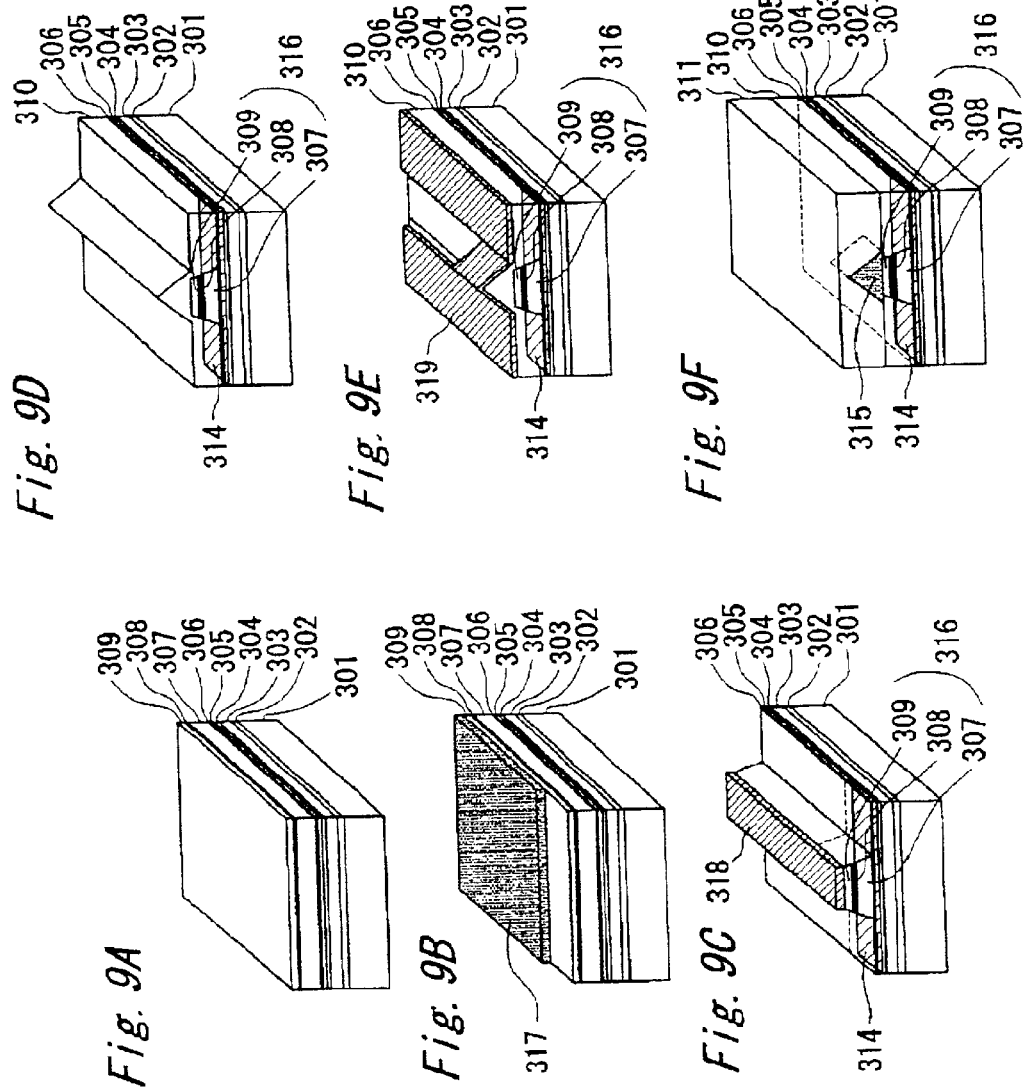

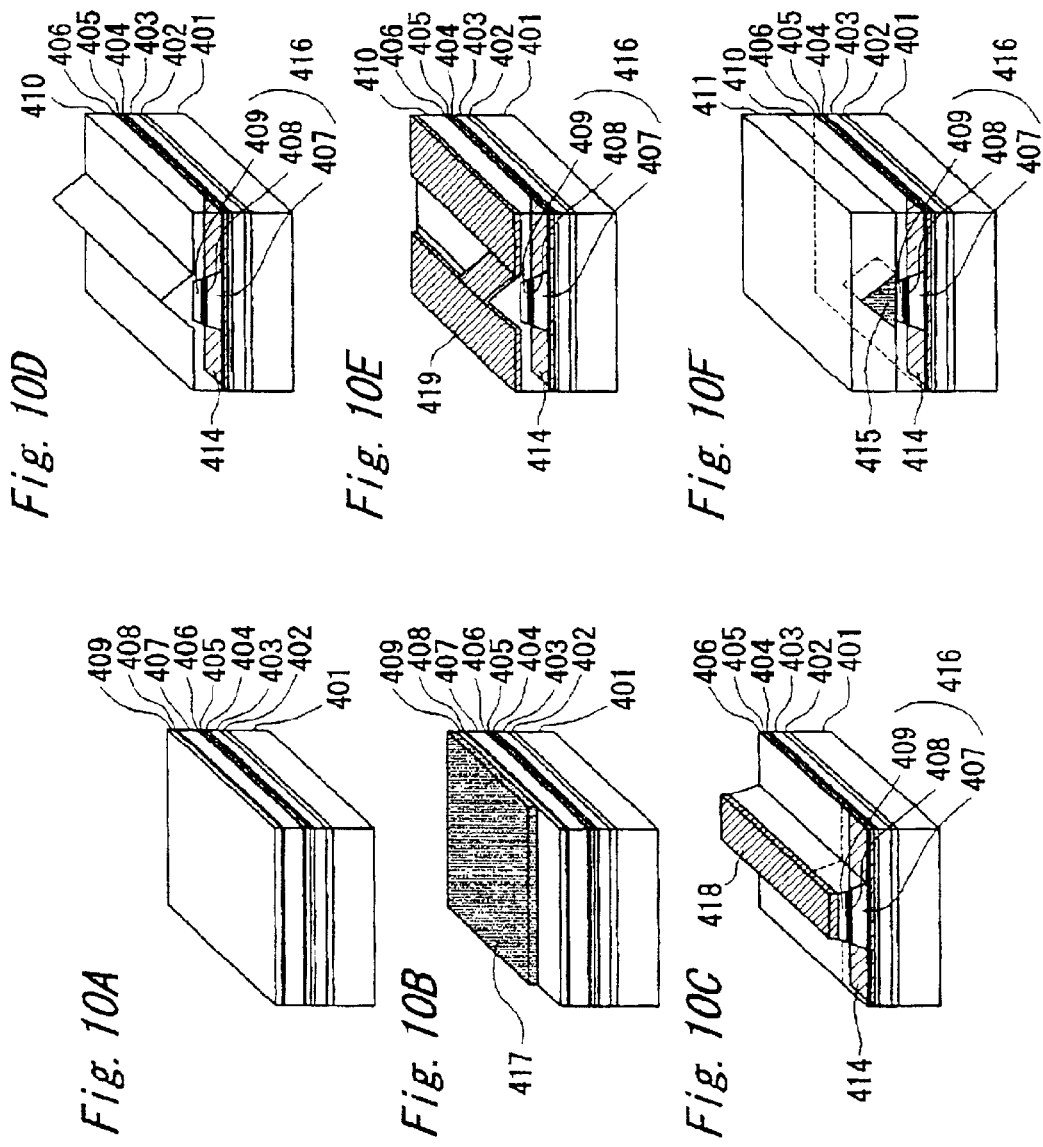

SEMICONDUCTOR LASER DEVICE AND MANUFACTURING METHOD THEREOF

BACKGROUND OF THE INVENTION

The present invention relates to a semiconductor laser device which is used for an optical disk and so on and to a manufacturing method thereof. More particularly, the present invention relates to a window structure semiconductor laser device which is especially excellent in characteristics of high output operation and to a manufacturing method thereof.

Recently, various kinds of semiconductor lasers have been widely used as a light source for an optical disk device. In Particular, a high output semiconductor laser has been used as a light source for write access to a disk such as a MD (Mini Disc) player and a CD-R (Compact Disc Recordable) drive, and is strenuously required to have higher output.

One of the factors which do not allow a semiconductor laser to have a higher output is catastrophic optical damage (COD). COD is generated when an optical output density increases in an active layer region in the vicinity of a laser resonator end surface which is served as a light emitting end surface.

Generation of the COD is attributed to the fact that the active region in the vicinity of the laser resonator end surface is a region for absorbing laser beams. In the laser resonator end surface, there are a number of non-radiative recombination centers of a surface level or an interface level. Carriers injected into the active layer in the vicinity of the laser resonator end surface are dissipated due to the non-radiative recombination, which makes density of the carriers injected in the active layer in the vicinity of the laser resonator end surface lower than that in a center portion thereof. As a result, the active layer region in the vicinity of the laser resonator end surface acts as an absorbing region for a wavelength of the laser beam formed with high injected carrier density in the central portion.

With higher optical output density, heat generation becomes larger locally in the absorbing region, which increases a temperature and thereby reduces bandgap energy. As a result, there is established positive feedback in which an absorption coefficient further increments and the temperature increases, which causes the temperature of the absorbing region in the vicinity of the laser resonator end surface to reach a melting point of the absorbing region, thereby generating COD.

As one of methods for allowing a semiconductor laser to have a higher output in order to improve the COD level, there has been employed a method for utilizing a window structure through disordering a multiquantum well structure active layer as disclosed in Japanese Patent Laid-Open Publication HEI No. 9-23037.

For showing a prior art example of semiconductor lasers having the window structure, structural drawings of a semiconductor laser device described in Japanese Patent Laid-Open Publication No. H9-23037 are provided in FIGS. 12A to 12C.

FIG. 12A is a perspective view including a laser resonator end surface. FIG. 12B is a cross sectional view taken along a line Ia–Ia' of FIG. 12A showing a wave guide. FIG. 12C is a cross sectional view in layer thickness direction taken along a line Ib–Ib' of FIG. 12A. In FIGS. 12A to 12C, there are shown a GaAs substrate 1001, an n-type AlGaAs lower cladding layer 1002, a quantum well active layer 1003, a p-type AlGaAs first upper cladding layer 1004a, a p-type AlGas second upper cladding layer 1004b, a p-type Gas contact layer 1005, a vacancy diffusion region 1006 (shaded portion), a proton injection region 1007 (shaded portion), a negative electrode 1008, a positive electrode 1009, a laser resonator end surface 1020, a region 1003a of the quantum well active layer 1003 contributing to laser emission, and a window structure region 1003b of the quantum well active layer 1003 formed in the vicinity of the laser resonator end surface 1020.

Next, description will be given of a method for manufacturing conventional semiconductor laser devices with reference to a flowchart shown in FIG. 13.

On an n-type GaAs substrate 1001, there are epitaxially grown an n type AlGaAs lower cladding layer 1002, a quantum well active layer 1003, and a p-type AlGaAs first upper cladding layer 1004a in sequence (FIG. 13A). Next, an $SiO_2$ film 1010 is formed on the surface of the p-type AlGaAs first upper cladding layer 1004a. Further, a stripe-shaped opening 1010a is formed in the $SiO_2$ film 1010 in such a way to extend in laser resonator direction but not to reach a laser resonator end surface (FIG. 133) A thus-prepared wafer is annealed at a temperature of 800° C. or more in an As atmosphere. During annealing, the $SiO_2$ film 1010 absorbs Ga atoms from the surface of the adjacent p-type AlGaAs first upper cladding layer 1004a, so that Ga vacancies are formed within the p-type AlGaAs first upper cladding layer 1004a. Some of the Ga vacancies diffuse till they reach the quantum well active layer 1003 inside the crystal, thereby causing disorder of the quantum well structure. In a disordered active layer region, an effective forbidden bandwidth extends, and therefore the disordered active layer region functions as a transparent window for emitted laser beans.

Then, the $SiO_2$ film 1010 is removed, and there are epitaxially grown a p-type AlGaAs second upper cladding layer 1004b and a p-type GaAs contact layer 1005 in sequence on the p-type AlGaAs first upper cladding layer 1004a (FIG. 13C). Next, a resist film is formed on the p-type GaAs contact layer 1005a. Then, a stripe-shaped resist 1011 is formed by photolithographic technique above the same region as the stripe-shaped opening 1010a of the $SiO_2$ film 1010. Then, with the stripe-shaped resist 1011 as a mask, protons are injected thorough the surface of the p-type GaAs contact layer 1005 into the p-type AlGaAs second upper cladding layer 1004b so as to form a high resisting region 1007 which serves as a current blocking layer (FIG. 13D). Finally, a negative electrode 1008 is formed on the GaAs substrate 1001, and a positive electrode 1009 is formed on the p-type GaAs contact layer 1005. The thus-completed wafer is cleaved to provide the semiconductor laser device of FIG. 12.

In the case of the conventional window structure semiconductor laser device, an $SiO_2$ film 1010 is formed on the surface of the p-type AlGaAs first upper cladding layer 1004a so that bandgap energy In the disordered region formed in the vicinity of the laser resonator end surface may become larger than bandgap energy corresponding to a laser emission wavelength. By formation of the SiO, film 1010, Ga vacancies are created in the p-type AlGas first upper cladding layer 1004a adjacent to the $Sio_2$ film 1010, and some of the Ga vacancies are diffused into the quantum well active layer 1003.

Creation and diffusion of the Ga vacancies are conducted in the region covered with the $SiO_2$ film 1010. However, annealing at a temperature of 800° C. or more causes creation of Ga vacancies, though small in amount due to re-evaporation of Ga atoms, in the uppermost surface of the region not covered with he $SiO_2$ film 1010 (region inside the laser resonator). As a result, the Ga vacancies are diffused into the quantum well active layer 1003.

Consequently, the bandgap of the quantum well active layer 1003 fluctuates inside the laser resonator, and the long-term reliability of the quantum well active layer 1003 is degraded due to deterioration of crystallinity.

If annealing temperature is lower or if annealing time is shorter as an countermeasure against the above problem, diffusion of Ga vacancies to the quantum well active layer 1003 may be inhibited inside the laser resonator. However, it becomes insufficient to create vacancies in the region covered with the $SiO_2$ film 1010 and to diffuse the vacancies to the quantum well active layer 1003 in the region covered with the $SiO_2$ film 1010. This results in adsorption of laser beams in the vicinity of the laser resonator end surface. As a result, COD is easily generated in the active layer region in the vicinity of the laser resonator end surface, which causes reduced maximum optical output in high output driving, and prevents implementation of sufficient long-term reliability.

SUMMARY OF THE INVENTION

It is an object of the present invention to provide a semiconductor laser device which inhibits fluctuation of the bandgap of an active layer inside a laser resonator and has excellent long-term reliability, as well as a method for manufacturing the same.

In order to accomplish the above object, the present invention provides a semiconductor laser device having a quantum well active layer including a well layer and a barrier layer laminated on a semiconductor substrate, in which a photoluminescence light from the quantum well active layer in a vicinity of a light emitting end surface is smaller in a peak wavelength than a photoluminescence light from the quantum well active layer in an internal region, wherein each of the well layer and the barrier layer of the quantum well active layer contains II group atoms.

According to the above constitution, the semiconductor laser device is so formed that the peak wavelength of the photoluminescence light from the quantum well active layer in the vicinity of the light emitting end surface is smaller than the peak wavelength of the photoluminescence light from the quantum well active layer in the internal region. This indicates that a bandgap of the quantum well active layer in the vicinity of the light emitting end surface is larger than a bandgap of the quantum well active layer in the internal region thereof.

The larger bandgap of the quantum well active layer in the vicinity of the light emitting end surface is achieved by vacancies which are introduced into the quantum well active layer in the vicinity of the light emitting end surface for example by annealing. Vacancies, though small in amount, are simultaneously introduced into the internal region of the quantum well active layer by annealing. These vacancies may cause fluctuation of the bandgap of the quantum well active layer in the internal region thereof and deterioration of crystallinity.

However, in the present invention, each of the well layer and the barrier layer of the quantum well active layer contains the II group atoms. Therefore, the II group atoms residing inside the quantum well active layer complement i.e. make up for vacancies in the internal region of the quantum, well active layer. Disappearance of vacancies in the internal region of the quantum well active layer prevents fluctuation of the bandgap of the quantum well active layer in the internal region thereof.

In one embodiment of the present invention, the semiconductor laser device further comprises two cladding layers for interposing the quantum well active layer therebetween, wherein impurity atoms contained in the cladding layers are identical to the II group atoms.

The II group atoms in the well layer and the barrier layer of the quantum well active layer may be supplied by diffusion of the impurity atoms from the cladding layers that interpose the quantum well active layer therebetween for example by annealing.

In one embodiment of The present invention, an impurity atom density of the II group atoms contained in the well layer is within a range from $3 \times 10^{17}$ cm$^{-3}$ to $1 \times 10^{13}$ cm$^{-3}$.

According to the present embodiment, the density of II group atoms in the well layer ranged from $3 \times 10^{17}$ cm$^{-3}$ to $1 \times 10^{18}$ cm$^{-3}$ makes it possible to prevent shift of the II group atoms to a cladding layer on the side of the substrate, and therefore to prevent shift of a p-n joint position to the side of the substrate. As a result, overflow of carriers from the quantum well active layer may be inhibited, and a semiconductor laser device with decreased driving current in high output may be implemented.

In one embodiment of the present invention, Si atoms are contained in a first cladding layer for interposing the quantum well active layer from a side of the semiconductor substrate, of the two cladding layers for interposing the quantum well active layer therebetween.

According to the present embodiment, the Si atoms contained in the first cladding layer make it possible to inhibit diffusion of the II group atoms because similar to the II group atoms, Si atoms tend to reside in III group atom sites. Consequently, driving current in high output may be decreased, and a semiconductor Laser device having excellent long-term reliability in high output driving may be implemented.

In one embodiment of the present invention, the II group atoms are contained in a second cladding layer for interposing the quantum well active layer from a side opposite to the side of the semiconductor substrate.

In one embodiment of the present invention, the semiconductor laser device further comprises ridge-shaped stripe geometry extended in a resonance direction and formed on a second cladding layer for interposing the quantum well active layer from a side opposite to a side of the semiconductor substrate, and wherein a current non-injection area selectively formed in a region in a vicinity of a light emitting end surface on the ridge-shaped stripe geometry.

According to the present embodiment, the current non-injection area is selectively formed in the region in the vicinity of the light emitting end surface on the ridge-shaped stripe geometry formed in the second cladding layer. The current non-injection area prevents electric current from flowing into a window region of the quantum well active layer in the region in the vicinity of the light emitting end surface, and inhibits carrier loss due to the presence of vacancy defects in the window region. Thereby, ineffective current not contributing to light emission is reduced. Consequently, driving current in high output may be decreased, and a semiconductor laser device may have excellent long-term reliability in high output driving.

In one embodiment of the present invention, the semiconductor substrate is composed of GaAs, and a semiconductor layer composed of at least an AlGaAs based material is laminated on the semiconductor substrate.

In one embodiment of the present invention, the semiconductor substrate is composed of GaAs, and
a semiconductor layer composed of at least an AlGaInP based material is laminated on the semiconductor substrate.

In one embodiment of the present invention, the II group atom is any one of a zinc atom, a beryllium atom and a magnesium atom.

According to the present embodiment, any one of a zinc atom, a beryllium atom and a magnesium atom is used as the II group atom. Those II group atoms may effectively complement the vacancies diffused into the quantum well active layer.

The present invent-on also provides a method for manufacturing a semiconductor laser device, comprising the steps of:

growing a laminated structure having a first conductivity type cladding layer, a quantum well active layer composed of a well layer and a barrier layer including II group atoms, and a second conductivity type cladding layer on a first conductivity type semiconductor substrate;

selectively forming a dielectric film in a vicinity of a light emitting end surface on the laminated structure; and making a peak wavelength of a photoluminescence light from the quantum well active layer beneath a region in which the dielectric film is formed smaller than a peak wavelength of a photoluminescence light from the quantum well active layer beneath a region in which the dielectric film is not formed, by annealing.

According to the above constitution, II group atoms are added in advance when the quantum well active layer grows inside the laminated structure formed on a first conductivity type semiconductor substrate. After the II group atoms are contained in the quantum well active layer, annealing is conducted with a dielectric film applied only to the region in the vicinity of the light emitting end surface of the laminated structure. As a result, constitutive atoms are absorbed from the surface of the laminated structure right under the dielectric film into the dielectric film, so that vacancies are created inside the laminated structure to diffuse into the quantum well active layer in the vicinity of the light emitting end surface. As a result, the bandgap of the quantum well active layer in the region in the vicinity of the light emitting end surface becomes larger than the bandgap in the internal region thereof.

In annealing, a small amount of vacancies are created also in the internal region on the surface of the laminated structure and are diffused into in the internal region of the quantum well active layer. However, the II group atoms contained in the quantum well active layer complement the small amount of vacancies, and therefore fluctuation of the bandgap of the quantum well active layer in the internal region thereof is inhibited. Further, because the quantum well active layer contains II group atoms prior to annealing, density inclination of the II group atoms in the vicinity of the quantum well active layer is small, which inhibits diffusion of II group atoms into the quantum well active layer caused by the annealing. Therefore, density increase of the II group atoms in the quantum well active layer in the internal region is inhibited, thereby making it possible to prevent deterioration of crystallinity of the quantum well active layer in the internal region.

Furthermore, because there is no density increase of the II group atoms in the quantum well active layer caused by the annealing as described above, diffusion of the II group atoms from the quantum well active layer into the first conductivity type cladding layer due to the annealing is inhibited, thereby making it possible to prevent overflow of carriers from the quantum well active layer in high output driving.

The present invention further provides a method for manufacturing a semiconductor laser device, comprising the steps of:

growing a laminated structure having a first conductivity type cladding layer, a quantum well active layer composed of a well layer and a barrier layer, and a second conductivity type cladding layer including II group atoms on a first conductivity type semiconductor substrate;

diffusing the II group atone in the second conductivity type cladding layer into the quantum well active layer by first annealing;

selectively forming a dielectric film in a region in a vicinity of a light emitting end surface on the laminated structure; and making a peak wavelength of a photoluminescence light from the quantum well active layer beneath a region in which the dielectric film is formed smaller than a peak wavelength of a photoluminescence light from the quantum well active layer beneath a region in which the dielectric film Is not formed, by second annealing.

According to the above constitution, when the II group atoms are added to the quantum well active layer, the II group atoms in the second conductivity type cladding layer are diffused into the quantum well active layer by annealing. There are, therefore, conducted two annealing steps including one which is conducted after a dielectric film is selectively applied. This equalizes a distribution of the II group atoms in the region in the vicinity of the quantum well active layer, and inhibits diffusion of the II group atoms into the first conductivity type cladding layer due to the annealing, thereby making it possible to prevent overflow of carriers from the quantum well active layer in high output driving.

In addition, constitutive atoms are absorbed from the surface of the laminated structure right under the dielectric film formed in the region in the vicinity of the light emitting end surface into the dielectric film, and vacancies are created inside the laminated structure, which promotes diffusion of the vacancies into the quantum well active layer. Here, because II group atoms are contained in the quantum well active layer, the II group atoms complement a small amount of vacancies, which are created in annealing on the surface of the laminated structure in the internal region and are diffused into the quantum well active layer. Therefore, fluctuation of the bandgap of the quantum well active layer in the internal region is inhibited.

The present invention also provides a method for manufacturing a semiconductor laser device, comprising the steps of:

growing a laminated structure having a first conductivity type cladding layer, a quantum well active layer composed of a well layer and a barrier layer including II group atoms, and a second conductivity type cladding layer on a first conductivity type semiconductor substrate;

selectively irradiating a region in a vicinity of a light emitting end surface of the laminated structure with ionized atoms; and making a peak wavelength of a photoluminescence light from the quantum well active layer beneath a region which is irradiated with the ionized atoms smaller than a peak wavelength of a photoluminescence light from the quantum well active layer beneath a region which is not irradiated with ionized atoms, by annealing.

According to the above constitution, II group atoms are added in advance when the quantum well active layer grows inside the laminated structure formed on a first conductivity type semiconductor substrate. After the II group atoms are contained in the quantum well active layer, only the region in the vicinity of the light emitting end surface on the laminated structure are irradiated with ionized atoms. As a result, vacancies are created on the surface of the laminated structure in the region irradiated with the ionized atoms, and diffusion of the vacancies into the quantum well active layer is promoted by annealing. As a result, the bandgap of the quantum well active layer in the region in the vicinity of the light emitting end surface becomes larger than the bandgap in the internal region.

Because II group atoms are contained in the quantum well active layer, the II group atoms complement a small amount of vacancies, which are created in annealing on the surface of the laminated structure in the internal region and are diffused into the quantum well active layer. Therefore, fluctuation of the bandgap of the quantum well active layer in the internal region is inhibited. Further, because the quantum well active layer contains II group atoms prior to annealing, density inclination of II group atoms in the vicinity of the quantum well active layer is small, which inhibits diffusion of II group atoms into the quantum well active layer caused by the annealing. Therefore, density increase of the II group atoms in the quantum well active layer in the internal region is inhibited, thereby making it possible to prevent deterioration of crystallinity of the quantum well active layer in the internal region.

Furthermore, because there is no density increase of the II group atoms in the quantum well active layer caused by the annealing as described above, diffusion of the II group atoms from he quantum well active layer into the first conductivity type cladding layer due to the annealing is inhibited, thereby making it possible to prevent overflow of carriers from the quantum well active layer in high output driving.

The present invention further provides a method for manufacturing a semiconductor laser device, comprising the steps of:

growing a laminated structure having a first conductivity type cladding layer, a quantum well active layer composed of a well layer and a barrier layer, and a second conductivity type cladding layer including II group atoms on a first conductivity type semiconductor substrate;

diffusing the II group atoms in the second conductivity type cladding layer into the quantum well active layer by first annealing;

selectively irradiating a region in a vicinity of a light emitting end surface of the laminated structure with ionized atoms; and making a peak wavelength of a photoluminescence light from the quantum well active layer beneath a region which is irradiated with the ionized atoms smaller than a peak wavelength of a photoluminescence light from the quantum well active layer beneath a region which is not irradiated with ionized atoms, by second annealing.

According to the above constitution, when the II group atoms are added to the quantum well active layer, the II group atoms in the second conductivity type cladding layer are diffused into the quantum well active layer by annealing. There are, therefore, conducted two annealing steps including one which is conducted after selective irradiation with the ionized atoms. This equalizes a distribution of the II group atoms in the region in the vicinity of the quantum well active layer, and inhibits diffusion of the II group atoms into the first conductivity type cladding layer caused by the annealing, thereby making it possible to prevent overflow of carriers from the quantum well active layer in high output driving.

Furthermore, ion irradiation of the region in the vicinity of the light emitting end surface on the laminated structure creates vacancies on the surface of the laminated structure, and diffusion of the vacancies into he quantum well active layer is promoted by annealing. Here, because II group atoms are contained in the quantum well active layer, the II group atoms complement a small amount of vacancies, which are created in annealing on the surface of the laminated structure in the internal region and are diffused into the quantum well active layer. Therefore, fluctuation of the bandgap of she quantum well active layer in the internal region is inhibited.

In one embodiment of the present invention, a dielectric film is used as a mask when the region in the vicinity of the light emitting end surface of the laminated structure is selectively irradiated with the ionized atoms.

According to the above constitution, using a dielectric film as a mask in irradiation with the ionized atoms implements low driving voltage compared with the case of using a resist.

In one embodiment of the present invention, the ionized atom is at least any one of argon, oxygen and nitrogen.

According to the above constitution, vacancies are effectively created on the surface of the laminated structure in the region in the vicinity of the light emitting end surface, and diffusion thereof into the quantum well active layer due to the annealing is promoted. As a result, disorder of the region in the vicinity of the light emitting end surface in the quantum well active layer is accelerated.

In one embodiment of the present invention, the II group atom is any one of a zinc atom, a beryllium atom and a magnesium atom.

According to the present embodiment, as the II group atom, any one of a zinc atom, a beryllium atom, and a magnesium atom is used and created in the cladding layer in the internal region, thereby enabling effective complementation between the vacancies to be diffused into the quantum well active layer and the II group atoms.

The semiconductor laser devices suitable for the present invention are required to have a quantum well active layer. Between the quantum well active layer and the cladding layer, there is preferably disposed a light guiding layer. The reason hereof is described below. In the case of disposing the light guiding layer, the light guiding layer is regarded as a part of the quantum well active layer of the present invention.

In a multiquantum well active layer without a light guiding layer, a radiation angle in vertical direction is too large, which causes problems in an optical characteristic, and hinders application to LD for disks.

The multiquantum well active layer without a light guiding layer also suffers abnormally high power density in the vicinity of the laser resonator end surface, i.e., the region in the vicinity of the light emitting end surface, as well as in the internal region, in addition to intense adsorption of laser beams, which tends to increase crystal defect. It is impossible to solve these problems even if the window structure is employed.

However, composing the quantum well active layer by interposing a multiquantum well between the light guiding layers makes it possible to alleviate the severity of the above-stated problems.

The function of the light guiding layer of the present invention is to make the II group atoms to complement vacancies, which are to be diffused into the quantum well layer inside the laser resonator, in a light guiding layer containing II group atoms, so as to reduce the amount of the vacancies diffused into the quantum well layer as much as possible. This makes it possible to ensure that the fluctuation of the bandgap of the active layer inside the laser resonator is inhibited.

In order to accomplish the present invention, the semiconductor laser device is preferably structured with the following constitutions.
1. Magnitude correlation of the bandgap is:
quantum well active layer<N-type cladding layer≦P-type cladding layer
2. The number of quantum well layers composing an active layer is 2 to 3 layers.
3. The thickness of a quantum well layer is 50 to 100 Å.
4. The light guiding layer adjacent to the N-type cladding layer may not contain II group atoms.

The method for manufacturing the above-stated semiconductor laser device having different bandgaps provided by irradiation with fine ionized atom is preferably further composed of the steps of:
forming another laminated structure including a second conductivity type etching stop layer, another second conductivity type cladding layer, and a second conductivity type protective layer, on the existing laminated structure on the semiconductor substrate;
forming a dielectric film on the laminated structure as an ion irradiation mask;
after making the bandgap in the vicinity of the resonator end surface of the quantum well active layer included in the laminated structure larger than the bandgap in the region inside the resonator by irradiation with ionized atoms,
forming a ridge-shape strip extending in resonator direction on a layer formed above the etching stop layer;
developing a first conductivity type current blocking layer on the semiconductor substrate including the ridge-shaped stripe; and
removing the first conductivity type current blocking layer on the dielectric film processed to be the ridge-shaped stripe.

Because the first conductivity type current blocking layer formed on the dielectric film on the laminated structure grows to have physical characteristics different from that of the first conductivity type current blocking layer formed on a layer other than the dielectric film, it is easily removed by etching.

Thus, in the ridge-shaped stripe in laser resonator direction, there may be created a current non-injection area only in the vicinity of the end surface thereof with simple constitutions.

BRIEF DESCRIPTION OF THE DRAWINGS

The present invention will become more fully understood from the detailed description given herein-below and the accompanying drawings which are given by way of illustration only, and thus are not limitative of the present invention, and wherein:

FIGS. 9A to 9F are schematic views showing a method for manufacturing the semiconductor laser device shown in FIG. 8;

FIGS. 10A to 10F are schematic views showing a method for manufacturing a semiconductor laser device according to a fifth embodiment of the present invention;

DETAILED DESCRIPTION OF THE PREFERRED EMBODIMENTS

Figure 1A:
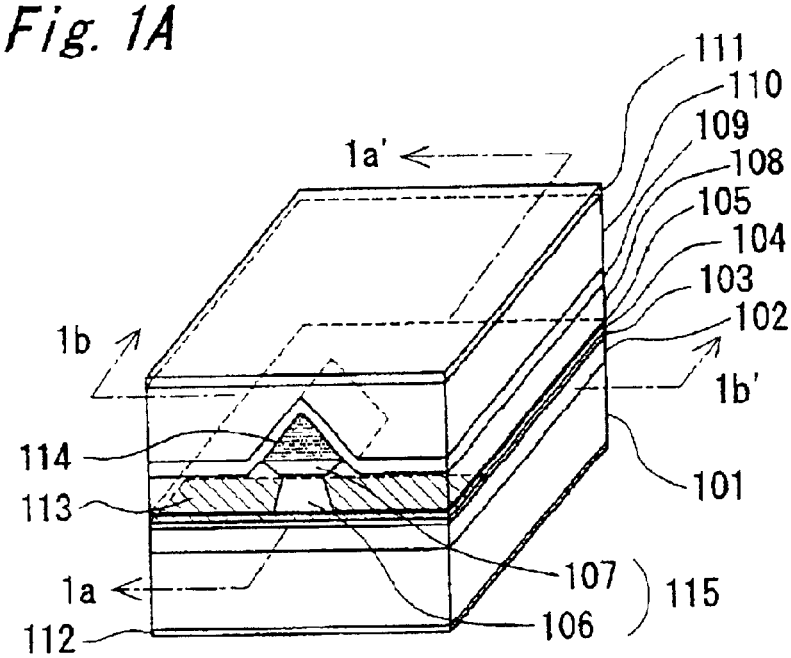
FIGS. 1A to 1C are cross sectional views showing constitution of a semiconductor laser device according to a first embodiment of the present invention.
Figure 1B:
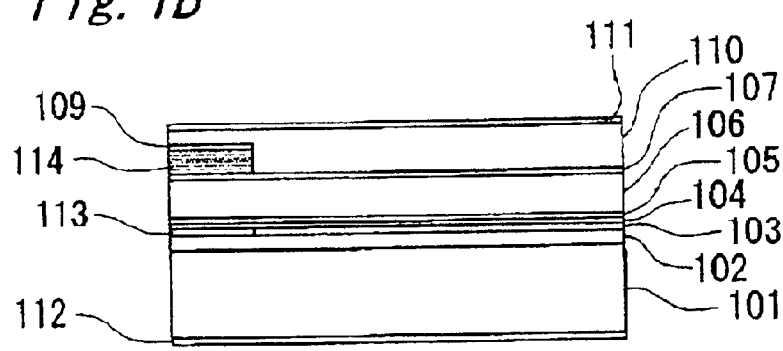
Figure 1C:
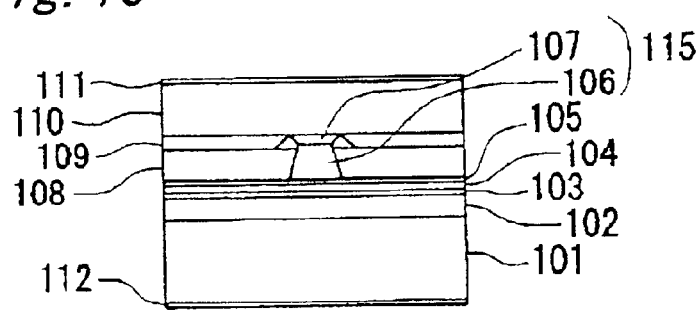

Hereinbelow, embodiments of the present invention will be described in detail with accompanied drawings.
First Embodiment FIGS. 1A to 1C are cross sectional views showing a semiconductor laser device in a first embodiment of the present invention. FIG. 1A is a perspective view including a light emitting end surface, FIG. 1B is a vertical cross sectional view taken along a line Ia–Ia' of FIG. 1A showing a wave guide, and FIG. 1C is a vertical cross sectional view in layer thickness direction taken along a line Ib–Ib' of FIG. 1A. In FIGS. 1A to 1C, there are shown: an n-type GaAs substrate 101; an n-type $Al_xGa_yAs$ (the values of x and y equal 0 or more and 1 or less: the definition thereof will be omitted hereinafter) first cladding layer 102; an active layer (MQW active layer) 103 composed of a multiquantum well structure having a barrier layer and a well layer laminated each other and light guiding layers interposing the multiquantum well structure therebetween, in which the barrier layers, the well layers and the light guiding layers each contain Zn atoms which belong to !I group atoms; a p-type $Al_xGa_yAs$ second cladding layer 104; a p-type etching stop layer 105; a p-type $Al_xGa_yAs$ third cladding layer 106 composed of a ridge stripe in resonator direction; a p-type GaAs protecting layer 107; an n-type $Al_xGa_yAs$ current blocking layer 108 formed so as to fill the lateral side of the p-type $Al_xGa_yAs$ third cladding layer; a p-type GaAs planarization layer 109; a p-type GaAs contact layer 110; a positive electrode 111; and a negative electrode 112.

In addition, there are shown in FIGS. 1A to 1C: a region (window region) 113 where bandgap energy of the MQW active layer in the vicinity of a laser resonator end surface is larger than bandgap energy of the MQW active layer 103 inside the laser resonator; a current non-injection area 114 composed of the n-type $Al_xGa_yAs$ current blocking layer 108 formed on the p-type GaAs protecting layer 107; and a stripe-shaped ridge 115 composed of the p-type $Al_xGa_yAs$ third cladding layer 106 and the p-type GaAs protecting layer 107.

Figure 2D:
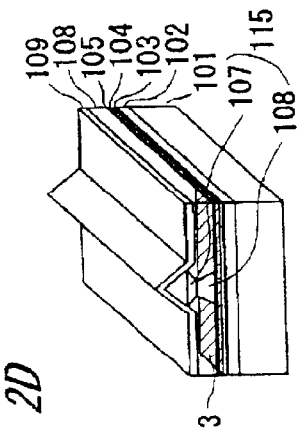
FIGS. 2A to 2F are schematic views showing a method for manufacturing the semiconductor laser device shown in FIG. 1.
Figure 2E:
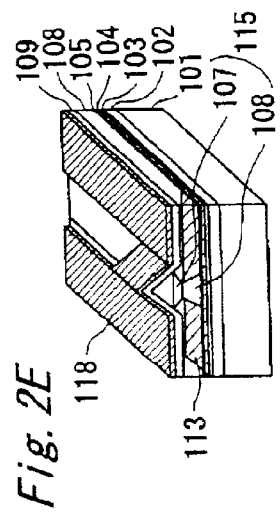

Description will now be given of a manufacturing method with reference to FIG. 2. On an n-type GaAs substrate 101 (carrier density of $2\times10^{18}$ $cm^{-3}$), there are epitaxially grown an n-type $Al_xGa_yAs$ first cladding layer 102 (carrier density of $8\times10^{17}$ $cm^{-3}$), an MQW active layer 103 containing Zn atoms which belong to II group atoms (Zn atom density of $8\times10^{17}$ $cm^{-3}$), a p-type $Al_xGa_yAs$ second cladding layer 104 (carrier density of $8\times10^{17}$ $cm^{-3}$), a p-type etching stop layer 105, a p-type $Al_xGa_yAs$ third cladding layer 106 (carrier density of $2\times10^{18}$ $cm^{-3}$), and a p-type GaAs protecting layer 107 (carrier density of $3\times10^{18}$ $cm^{-3}$) in sequence by the Metal-Organic Chemical Vapor Deposition (MOCVD) method (FIG. 2A). Each of the layers 101 and 102 contains Si atoms, and each of the layers 103 to 107 contains Zn atoms which belong to II group atoms.

Then, on a surface of the p-type GaAs protecting layer 107 in the vicinity of the laser resonator end surface, there is formed a stripe-shaped $Si_xO_y$ (the values of x and y equal 1 or more) film 116 which is a dielectric film with a width of 40 μm in direction orthogonal to the ridge stripe by the plasma CVD technique and the photolithographic technique. A pitch of the stripe is 800 μm which is equal to a resonator length (FIG. 2B).

Next, annealing is carried out by using the Rapid Thermal Anneal (RTA) technique. The annealing is conducted at a temperature of 950° C., at a temperature increasing rate of 100° C./sec and for a retention time of 60 sec so as to make bandgap energy of the MQW active layer (window region) 113 right under the $Si_xO_y$ film 116 larger than bandgap energy of the MQW active layer (active region) 103 in an inside region of the laser resonator. Specifically, Ga and As atoms are pumped up by the annealing from the surface of the p-type GaAs protecting layer 107 right under the dielectric $Si_xO_y$ film 116 into the $Si_xO_y$ film 116. Consequently, vacancies are created inside the p-type GaAs protecting layer 107, and are diffused in direction of the n-type GaAs substrate 101, thereby disordering the MQW active layer 103. As a result, the MQW active layer (window region) 113 right under the $Si_xO_y$ film 116 has bandgap energy larger than that of the MQW active layer (active region) 103 inside the resonator.

Thereafter, the $Si_xO_y$ film 116 is removed, and a stripe-shaped resist mask 117 is formed on the p-type GaAs protecting layer 107 by a known photolithographic technique to extend in direction of [0 1 1] or [0-1-1]. Further, the p-type GaAs protecting layer 107 and the p-type $Al_xGa_yAs$ third cladding layer 106 are processed by a known etching technique to form a stripe-shaped ridge 115 with a width of approximately 3 μm extending in direction of [0 1 1] or [0-1-1] and for etching so as to reach the p-type etching stop layer 105 (FIG. 2C).

Next, the stripe-shaped resist mask 117 formed on the p-type GaAs protecting layer 107 is removed. The lateral sides of the ridge 115 are filled with an n-type $Al_xGa_yAs$ current blocking layer 108 (carrier density of $1\times10^{18}$ $cm^{-3}$) and a p-type GaAs planarization layer 109 (carrier density of $3\times10^{18}$ $cm^{-3}$) by a second MOCVD (FIG. 2D).

Then, with use of a known photolithographic technique, a resist mask 118 is formed on the p-type GaAs planarization layer 109 formed on the lateral sides of the ridge 115 and on the stripe-shaped p-type GaAs planarization layer 109 with a width of 40 μm formed on the ridge 115 in the vicinity of the laser resonator end surface. With use of a known etching technique, the n-type $Al_xGa_yAs$ current blocking layer 108 and the p-type GaAs planarization layer 109 in an opening of the resist mask 118 are selectively removed (FIG. 2E).

Figure 2F:
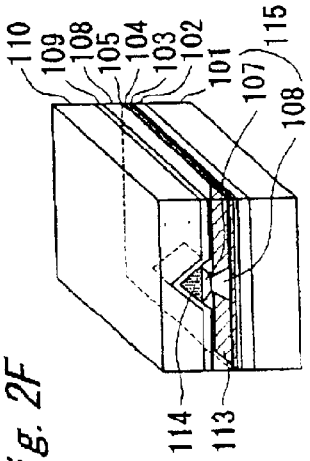
Figure 2A:
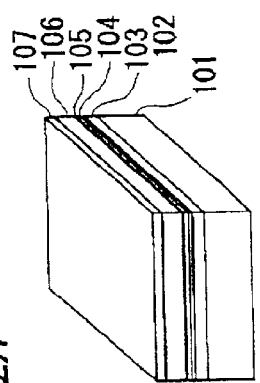
Figure 2B:
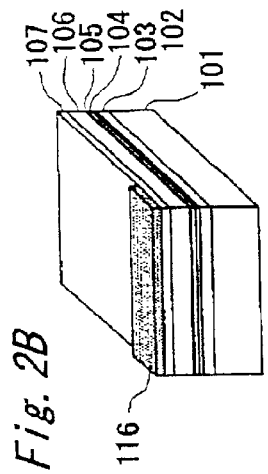
Figure 2C:
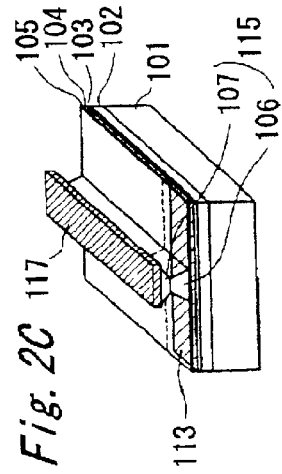

Next, the resist mask 118 formed on the p-type GaAs planarization layer 109 is removed, and a p-type GaAs contact layer 110 (carrier density of $1\times10^{19}$ $cm^{-3}$) is formed by third MOCVD (FIG. 2F). Further, a positive electrode 111 is formed on the top surface, and a negative electrode 112 is formed on the bottom surface.

After that, a scribe line is provided to the approximate center of the region in the vicinity of the laser resonator end surface with a width of 40 μm, and the wafer is divided into bars in length direct-on of the resonator.

Finally, the light emitting end surface on both sides of a bar is provided with a reflection coating, and the bar is further divided into chips. Thus, there is manufactured a device having a window region and a current non-injection region with a length of approximately 20 μm on the laser resonator end surface of the resonator with a length of 800 μm.

With use of a part of a wafer made by the manufacturing method of the semiconductor laser device according to the present embodiment, a peak wavelength of the MQW active layer 103 was measured immediately after epitaxial growth by Photo-Luminescence (PL) technique and the result thereof was 775 nm.

For comparison, with use of a part of a wafer made by a conventional manufacturing method of the semiconductor laser device, in which the MQW active layer 103 was not doped with II group atoms in the process of epitaxial growth, a peak wavelength of the MQW active layer 103 was measured immediately after epitaxial growth, and the result thereof was also 775 nm. This makes it clear that doping the MQW active layer 103 with II group atoms in the process of epitaxial growth will not affect the peak wavelength of the MQW active layer 103.

Next, with use of a part of the wafer after annealing by the RA technique which wafer was made according to the manufacturing method of the present embodiment, peak wavelengths of the MQW active layer (window region) 113 right under the $Si_xO_y$ film 116 and the MQW active layer (active region) 103 inside the laser resonator were each measured by the PL technique. As a result, the peak wavelength of the window region 113 was 745 nm and the peak wavelength of the active region 103 was 775 nm. This indicates that the peak wavelength of an emission spectrum from the window region 113 shifts by 30 nm to a short wavelength side compared with the peak wavelength of the emission spectrum from the active region 103. Also, the peak wavelength of photo-luminescence of the active region 103 after annealing by the RTA technique is equal to the peak wavelength of the photo-luminescence immediately after the epitaxial growth.

For comparison, with use of a part of the wafer after annealing by the RTA technique which wafer was made according to the conventional manufacturing method of the semiconductor laser device, in which the MQW active layer 103 was not doped with II group atoms in the process of epitaxial growth, peak wave lengths of the window region 113 and the active region 103 were each measured by the PL technique. As a result, he peak wavelength of the window region 113 was 740 nm, and the peak wavelength of the active region 103 was 770 nm. It indicates that the peak wavelength of the emission spectrum from the window region 113 shifts by 30 nm to a short wavelength side compared with the peak wavelength of the emission spectrum from the active region 103. Also, the peak wavelength of the emission spectrum from the active region 103 after annealing by the PTA technique shifts by 5 nm to a short wavelength side compared with the wavelength of the MQW active layer 103 immediately after the epitaxial growth.

Most emission spectrum of the active layer measured by the PL technique is obtained by recombination of electrons with holes of a valence band, which electrons resides in the active layer and are exited to a conduction band by incidence of exciting light with energy larger than the bandgap energy i.e. forbidden bandwidth of the active layer on the active layer. Consequently, the peak energy of the emitting spectrum of the photo-luminescence is almost equal to the bandgap energy of the active layer. Therefore, the peak wavelength of photo-luminescence is approximately in inverse relation to the bandgap energy of the active layer.

As is clear from the above description, in the case of the semiconductor laser device obtained by the manufacturing method of the present embodiment, the bandgap of the active layer in the vicinity of the laser resonator end surface is larger than the bandgap of the active layer inside the laser resonator, and fluctuation of the bandgap of the active layer inside the laser resonator is reduced.

In the manufacturing method of the present embodiment, Ga and As atoms are pumped up by annealing with the RTA technique from the surface of the p-type GaAs protecting layer 107 right under the $Si_xO_y$ film 116, which is a dielectric film, into the $Si_xO_y$ film 116. Consequently, vacancies are created inside the p-type GaAs protecting layer 107, and are diffused in direction of the n-type GaAs substrate 101, thereby disordering the MQW active layer. As a result, the MQW active layer right under the $Si_xO_y$ film 116 has increased bandgap energy, which creates a window region whose forbidden bandwidth is effectively larger than that of the MQW active layer (active region) inside the resonator.

In addition, in the manufacturing method of the present embodiment, the MQW active layer 103 is doped with II group atoms in the process of epitaxial growth. Consequently, if vacancies are created inside the laser resonator during the epitaxial growth process and the annealing process to diffuse the vacancies into the MQW active layer, the II group atoms residing all over the MQW active layer 103 complement the vacancies. This makes it possible to restrain the MQW active layer from being disordered, thereby suppressing the fluctuation of the bandgap of the MQW active layer inside the laser resonator.

Figure 3:
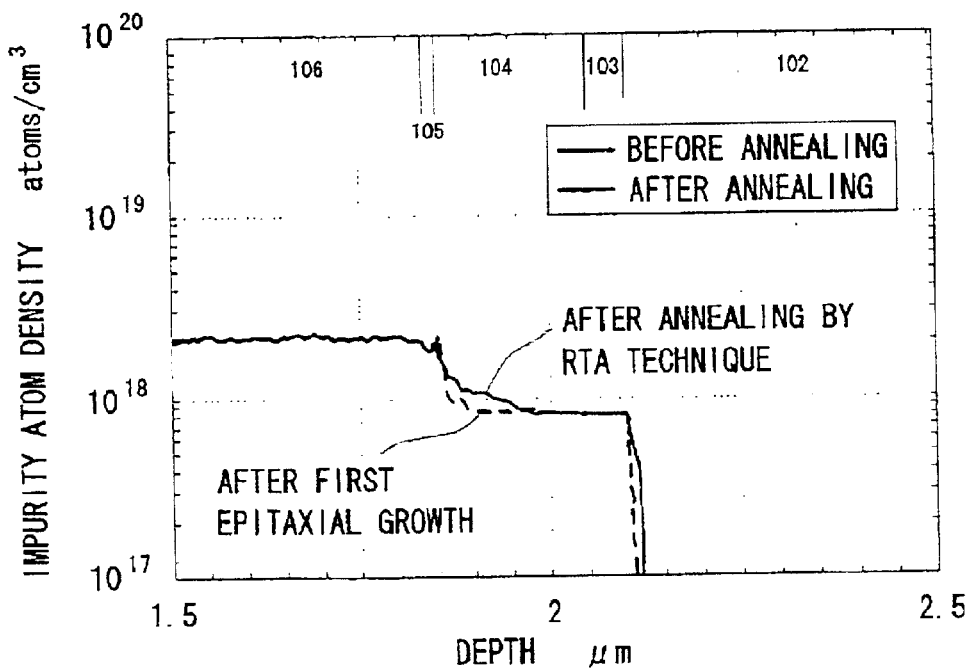
FIG. 3 is a view showing a distribution in depth direction of Zn atoms in the region inside a laser resonator before and after annealing of the semiconductor laser device shown in FIG. 1 by RTA technique.

FIG. 3 shows a distribution of Zn atoms inside the laser resonator in depth direction thereof before and after annealing by the RTA technique with regard to a semiconductor laser device of the present invention obtained by the above-stated manufacturing method.

Figure 4:
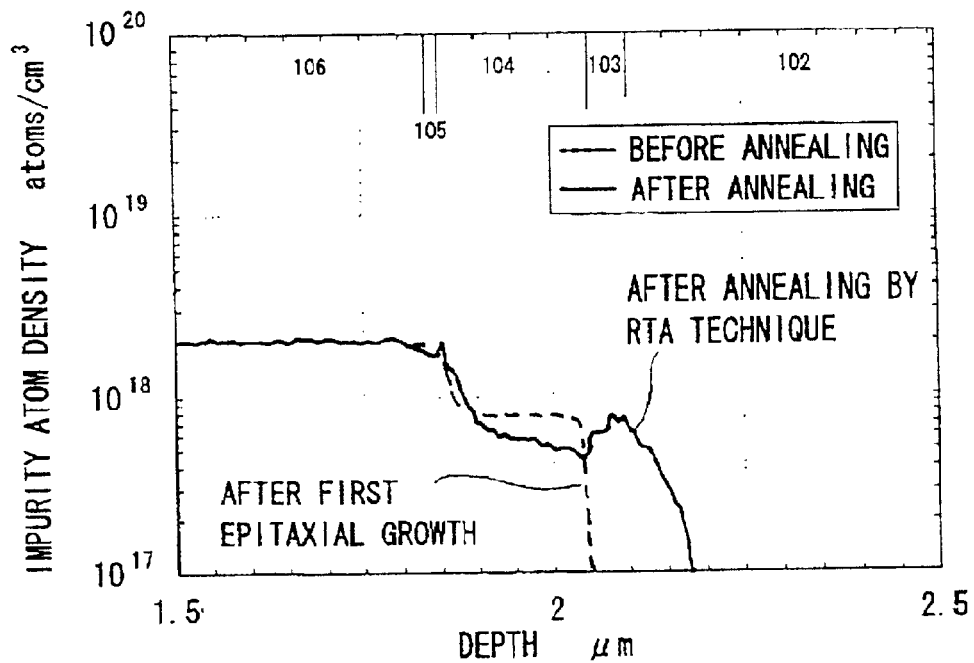
FIG. 4 is a view showing a distribution in depth direction of Zn atoms inside the laser resonator before and after annealing of a semiconductor laser device provided by a prior art manufacturing method by RTA technique.

For comparison, FIG. 4 shows a distribution of Zn atoms inside the laser resonator in depth direction thereof before and after annealing by the RTA technique on a semiconductor laser device according to a conventional manufacturing method, in which the MQW active layer 103 is not doped with II group atoms in the process of epitaxial growth.

The depth-directional distributions of Zn atoms shown in FIGS. 3 and 4 are measured by a Secondary Ion Mass Spectrometer (SIMS). The vertical axis of FIGS. 3 and 4 indicates impurity atom density in a unit of atoms/cm$^3$, while the horizontal axis thereof indicates a depth in a unit of $\mu$m from a p-type GaAs protection layer. In FIGS. 3 and 4, a broken line and a solid line show depth-directional distributions of Zn atoms before and after annealing, respectively.

As shown in FIG. 3, no change is seen in Zn atom density of the MQW active layer 103 after annealing by the RTA technique, and therefore it is not shown that Zn atoms are diffused into the side of the n-typo $Al_xGa_yAs$ first cladding layer 102.

As shown in FIG. 4, on the contrary, Zn atoms are stored within the MQW active layer 103 after annealing by the RTA technique, and it is shown that the Zn atoms are diffused into the side of the n-type $Al_xGa_yAs$ first cladding layer 102.

FIG. 3 proves that doping the MQW active layer 103 with II group atoms in the process of epitaxial growth not only enables restraint of increase in Zn atom density in the MQW active layer 103, but also enables restraint of diffusion of Zn atoms into the side of the n-type $Al_xGa_yAs$ first cladding layer 102.

Si atoms used as n-type conductivity type impurities in the present embodiment are contained in the n-type $Al_yGa_{-y}As$ first cladding layer 102. The Si atoms tend to reside in the position of the III group atoms similar to Zn atoms which belong to II group atoms. For this reason, diffusion of Zn atoms into the n-type $Al_xGa_yAs$ first cladding layer 102 does not occur unless a great number of Zn atoms reside in the MQW active layer 103. Zn atoms, which are impurity atoms from II group atoms, residing in epitaxially grown layers 104 to 107 have large diffusivity, so that annealing by the RTA technique tends to invoke diffusion of Zn atoms into the MQW active layer 103. However, even in the case of the atoms having large diffusivity, the diffusing phenomenon is disturbed if density inclination is small. In the semiconductor laser device of the present embodiment, the MQW active layer 103 already contains Zn atoms before annealing, which makes density inclination of Zn atoms small. Therefore, small density inclination of Zn atoms makes it possible to restrain increase of Zn density in the MQW active layer 103 by annealing, and further suppress diffusion of Zn atoms into the side of the n-type $Al_xGa_yAs$ first cladding layer 102.

There was conducted measurement of characteristics including emission wavelength and driving current of the semiconductor laser device obtained by the manufacturing method of the present embodiment.

For comparison, there was also conducted measurement of the characteristics of the semiconductor laser device according to the conventional manufacturing method, in which the MQW active layer 103 was not doped with II group atoms in the process of epitaxial growth.

The result of the measurement showed that an emission wavelength ($\lambda$) of the semiconductor laser device of the present embodiment in the case of CW 120 mW was 758 nm, and an emission wavelength ($\lambda$) of the conventional semiconductor laser device in the case of CW 120 mW was 780 nm. A driving current (Iop) of the semiconductor laser device of the present embodiment in the case of CW 120 mW was 150 mA, and a driving current (Iop) of the conventional semiconductor laser device in the case of CW 120 mW was 210 mA. Those results prove that the manufacturing method of the semiconductor laser device according to the present embodiment enables constraint of the emission wavelength from being shortened, and enables reduction of the driving current.

The constraint of the wavelength from being shortened is implemented by decreased diffusion of vacancies into the MQW active layer 103 inside the laser resonator. The reduction of the driving current is implemented by restraint of increase in density of Zn atoms in the MQW active layer 103, by restraint of diffusion of the Zn atoms into the n-type $Al_xGa_yAs$ first cladding layer 102 inside the laser resonator, and by restraint of overflow of carriers from the MQW active layer 103.

In the present embodiment, the $Si_xO_y$ (the values of x and y equal 1 or more) film is used as a dielectric film. However, either $Si_xN_y$ or $Si_xO_yN_z$ (the values of x, y, and z equal 1 or more) film enables creation of vacancies in the p-type GaAs protecting layer 107 under the dielectric film 116, and enables creation of a window region in the active layer in the vicinity of the laser resonator end surface, whose forbidden bandwidth is effectively larger than that of the MQW active layer (active region) inside the laser resonator. The $Si_xO_yN_z$ film used according to the present embodiment implements the same effect as stated above.

Although Zn atoms are used as II group atoms in the present embodiment, use of either Be or Mg atoms implements the same effect as stated above.

Although $Al_xGa_yAs$ based semiconductor lasers is used in the present embodiment, $Al_xGa_yIn_zP$ (the values of x, y, and z equal 1 or less) based semiconductor lasers also implements the same effect as stated above.

Second Embodiment

A manufacturing method in a second embodiment of the present invention will be described with reference to FIG. 5. As a feature of the second embodiment, an MQW active layer does not originally contain Zn atoms belonging to II group atoms.

Figure 5D:
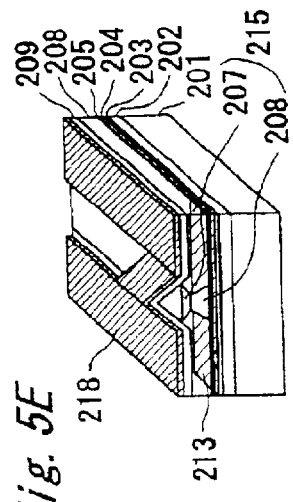
FIGS. 5A to 5F are schematic views showing a method for manufacturing a semiconductor laser device according to a second embodiment of the present invention.
Figure 5E:
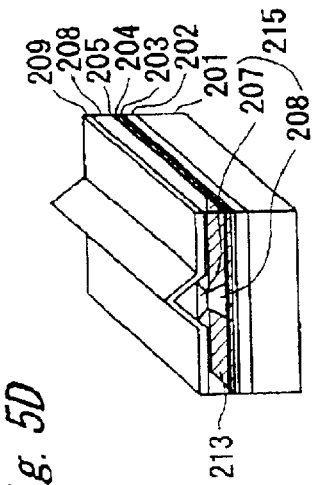
Figure 5F:
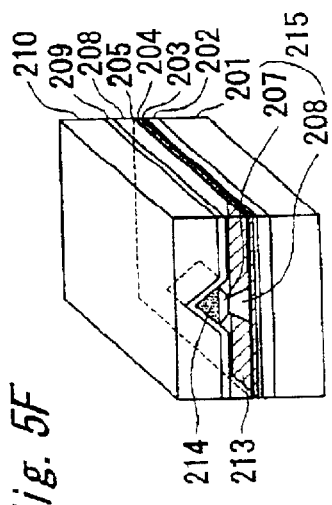
Figure 5A:
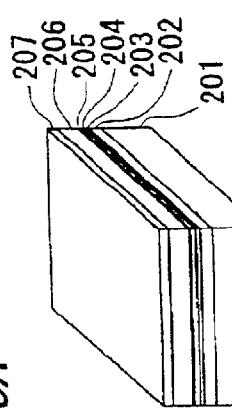

On an n-type GaAs substrate 201 (carrier density of $2\times10^{18}$ cm$^{-3}$), there are epitaxially grown an n-type $Al_xGa_y$ As (the values of x and y equal 1 or less: the definition thereof will be omitted hereinafter) first cladding layer 202 (carrier density of $8\times10^{17}$ cm$^{-3}$), an MQW active layer 219, a p-type $Al_xGa_yAs$ second cladding layer 204 (carrier density of $8\times10^{17}$ cm$^{-3}$), a p-type etching stop layer 205, a p-type $Al_xGa_yAs$ third cladding layer 206 (carrier density of $2\times10^{19}$ cm$^{-3}$), and a p-type GaAs protecting layer 207 (carrier density of $3\times10^{18}$ cm$^{-3}$) in sequence by Meal-Organic Chemical Vapor Deposition (MOCVD) method (FIG. 5A). Here, each of the layers 201 and 202 contains Si atoms, and each of the layers 204 to 207 contains Zn atoms which belong to II group atoms, although the MQW active layer 219 does not contain Si atoms and Zn atoms belonging to II group atoms.

Next, in order for the MQW active layer 203 to contain contains Zn atoms belonging to II group atoms, first annealing is carried out to diffuse Zn atoms, which are contained in each of the layers 204 to 207 of the above stated wafer, into the MQW active layer 219. Annealing is conducted at a temperature of 700° C. for a retention time of 2 hours under an ambient atmosphere containing As atoms which belong to V group atoms.

With use of a part of a wafer after the first annealing, Zn atom density in the well layer of the MQW active layer 203 was measured by the secondary ion mass spectrometer (SIMS), and the result thereof was $8\times10^{17}$ cm$^{-3}$.

With use of a part of the wafer after the first annealing, a peak wavelength of the MQW active layer 203 was measured by PL technique. The peak wavelength of the MQW active layer 203 was 775 nm.

For comparison, with use of a part of the wafer immediately after the process of epitaxial growth, a peak wavelength of the MQW active layer 219 was measured by the PL technique, and it was 775 nm. This makes it clear that carrying out the first annealing does not affect the peak wavelength of the MQW active layer.

Figure 5B:
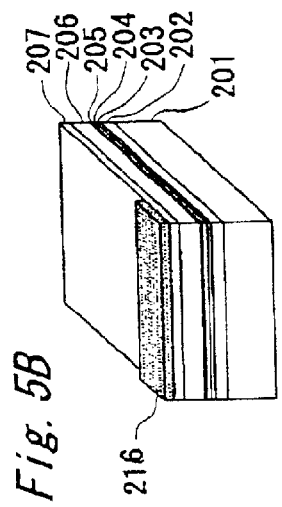

Then, as in the case with the first embodiment, on the surface of the p-type GaAs protecting layer 207 in the vicinity of the laser resonator end surface, there is formed a stripe-shaped $Si_xO_y$ (the values of x and y equal 1 or more) film 216 which is a dielectric film with a width of 40 μm in direction orthogonal to the ridge stripe by plasma CVD technique and photolithographic technique. A pitch of the stripe is 800 μm which is equal to a resonator length (FIG. 5B).

Next, second annealing is carried by using Rapid Thermal Anneal (RTA) technique out to make the bandgap energy of the MQW active layer (window region) 213 right under the $Si_xO_y$ film 216 larger than the bandgap energy of the MQW active layer (active region) 203 inside the laser resonator. Annealing is conducted at a temperature of 950° C., at a temperature increasing rate of 100° C./sec and for a retention time of 60 sec.

With use of a part of the wafer after the second annealing by the RTA technique, a peak wavelength of the MQW active layer (window region) 213 right under the dielectric $Si_xO_y$ film 216 and a peak wavelength of the MQW active layer (active region) 203 inside the laser resonator were measured by the PL technique. As a result, the peak wavelength of the window region 213 was 745 nm and the peak wavelength of the active region 203 was 775 nm. This indicates that the peak wavelength of an emission spectrum from the window region 213 shifts by 30 nm to a short wavelength side compared with the peak wavelength of the emission spectrum from the active region 203. Also, the peak wavelength of the photo-luminescence of the active region 103 after the second annealing is equal to the peak wavelength of the photo-luminescence after the first annealing.

The above description proves that the bandgap of the active layer in the vicinity of the laser resonator end surface is larger than the bandgap of the active layer inside the laser resonator, and that the fluctuation of the bandgap of the active layer inside the laser resonator is restrained in the semiconductor laser device.

Figure 5C:
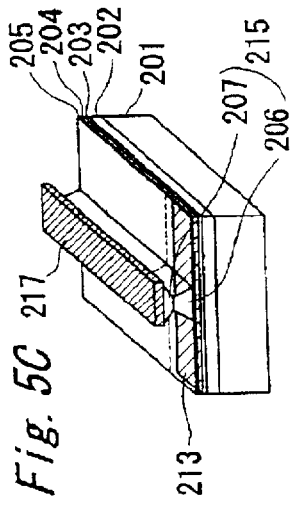

Thereafter, as in the case with the first embodiment, the $Si_xO_y$ film 216 which is a dielectric film formed in the vicinity of the laser resonator are removed, and a stripe-shaped resist mask 217 is formed on the p-type GaAs protecting layer 207 by a known photolithographic technique to extend in direction of [0 1 1] or [0-1-1]. Further, the p-type Gas protecting layer 207 and the p-type $Al_xGa_yAs$ third cladding layer 206 are processed by a known etching technique o form a stripe-shaped ridge 215 with a width of approximately 3 μm extending in direction of [0 1 1] or [0-1-1] so as to reach the p-type etching stop layer 105 (FIG. 5C).

Next, the stripe-shaped resist mask 217 formed on the p-type GaAs protecting layer 207 is removed. The lateral sides of the ridge 215 are filled with an n-type $Al_xGa_yAs$ current blocking layer 208 (carrier density of $1\times10^{18}$ cm$^{-3}$) and a p-type GaAs planarization layer 209 (carrier density of $3\times10^{18}$ cm$^{-3}$) by the second MOCVD (FIG. 5D).

Then, with use of a known photolithographic technique, a resist mask 218 is formed on the p-type GaAs planarization layer 209 formed on the lateral side of the ridge 115 and on the stripe-shaped p-type GaAs planarization layer 209 with a width of 40 μm formed on the ridge 215 in the region in the vicinity of the laser resonator. With use of the known etching technique, the n-type AlGaAs current blocking layer 208 and the p-type GaAs planarization layer 209 in an opening of the resist mask 218 are selectively removed (FIG. 5E).

Next, the resist mask 218 formed on the p-type GaAs planarization layer 209 is removed, and a p-type GaAs contact layer 210 (carrier density of $1\times10^{19}$ cm$^{-3}$) is formed by third MOCVD (FIG. 5F). Further there are formed a positive electrode 211 on tine top surface, and a negative electrode 212 on the bottom surface.

After that, a scribe line is provided to the approximate center of the region in the vicinity of the laser resonator end surface with a width of 40 μm, and the wafer is divided into bars in length direction thereof.

Finally, the light emitting end surface on both sides of a bar is provided with a reflection coating, and the bar is further divided into chips. Thus, there is manufactured a device having a window region and a current non-infection region with a length of approximately 20 λm on the Laser resonator end surface of the resonator with a length of 800 μm.

Figure 6:
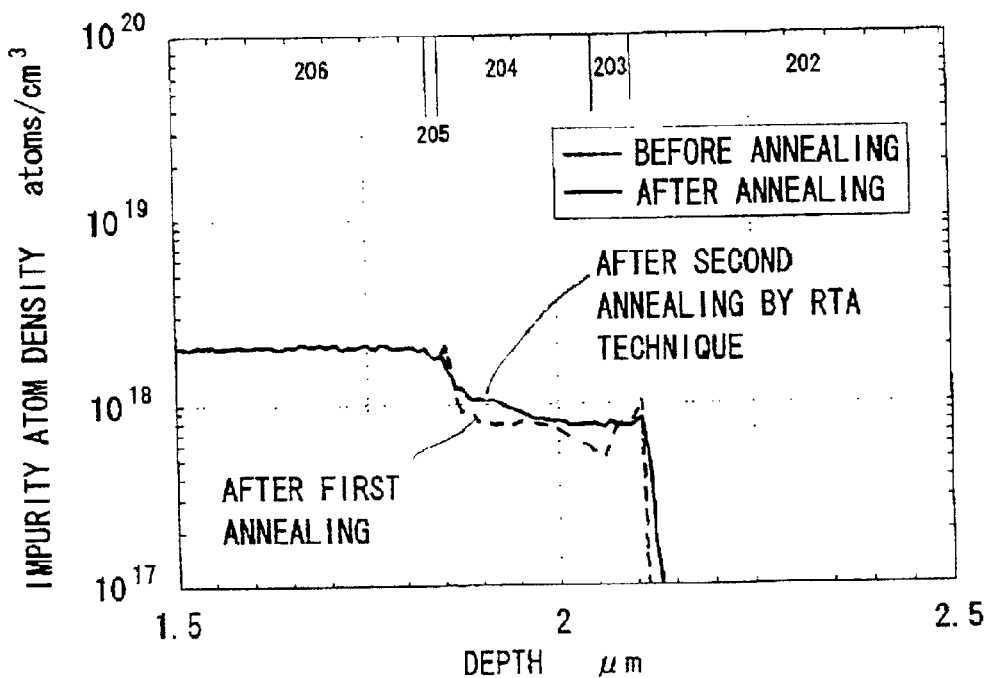
FIG. 6 is a view showing a distribution in depth direction of Zn atoms inside the laser resonator after first annealing and second annealing by RTA technique in the second embodiment.

FIG. 6 shows distributions of Zn atoms inside the laser resonator in depth direction thereof after the first annealing and after the second annealing by the RTA technique.

The depth-directional distributions Of Zn atoms shown in FIG. 6 are a result of measurement performed by using a secondary ion mass spectrometer (SIMS). The vertical axis of FIG. 6 indicates impurity atom density in atoms/cm$^3$, while the horizontal axis thereof indicates a depth in μm from a p-type GaAs protection layer. In FIG. 6, a broken line shows a depth-directional distribution of Zn atoms in the vicinity of the laser resonator end surface after the first annealing performed prior to forming the $Si_xO_y$ film 216 of a dielectric film. In FIG. 6, a solid line shows a depth-directional distribution of Zn atoms after the second annealing performed posterior to forming the $Si_xO_y$ film 216.

As shown in FIG. 6, the distribution of Zn atoms after the first annealing shown in the broken line indicates that Zn atoms are diffused into the MQW active layer (active region) 203, but not diffused into the side of the n-type $Al_xGa_yAs$ first cladding layer 202. In addition, Zn atoms are piled up in the vicinity of an interface between the n-type $Al_xGa_yAs$ first cladding layer 202 and the MQW active layer (active region) 203. Consequently, Zn atom density is decreased in the vicinity of an interface between the MQW active layer 203 and the p-type $Al_xGa_yAs$ second cladding layer 204.

Further, as shown in FIG. 6, the distribution of Zn atoms after the second annealing by the RTA technique shown in the solid line indicates that the diffusion of Zn atoms into the side of the n-type $Al_xGa_yAs$ first cladding layer 202 is not seen, and therefore there is shown a flat distribution of Zn atoms in the vicinity of the MQW active layer 203. Therefore, there are no Zn atoms piled up in the interface between the n-type $Al_xGa_yAs$ first cladding layer 202 and the MQW active layer 203. Also, there is no decreased portion of Zn atom density in the vicinity of the interface between the MQW active layer (active region) 203 and the p-type $Al_xGa_yAs$ second cladding layer 204.

By the first annealing according to the manufacturing method of the present embodiment, Zn atoms residing in the vicinity of the interface of p-type $Al_xGa_yAs$ second cladding layer 204 diffuse mainly into the MQW active layer 203. However, diffusion of the Zn atoms from the MQW active layer 203 to the n-type $Al_xGa_yAs$ first cladding layer 202 is prevented because Si atoms reside in the n-type $Al_xGa_yAs$ first cladding layer 202. Therefore, the Zn atoms are piled up at the interface between the MQW active layer 203 and the n-type $Al_xGa_yAs$ first cladding layer 202. Consequently, a high density area of Zn atoms is created within the MQW active layer 203 next to the n-type $Al_xGa_yAs$ first cladding layer 202, which in turn a low density area of Zn atoms is formed in the vicinity of the interface between the MQW active layer 203 and the p-type $Al_xGa_yAs$ second cladding layer 204.

Next, through the second annealing by the RTA technique, Zn atoms residing in layers 204 to 207 and in the MQW active layer 203 next to the n-type $Al_xGa_yAs$ first cladding layer 202 are diffused into a low density area of Zn atoms formed in the vicinity of the interface between the MQW active layer 203 and the p-type $Al_xGa_yAs$ second cladding layer 204. Consequently, density inclination of the Zn atoms in the vicinity of MQW active layer 203 is eliminated. Diffusion of the Zn atoms from the MQW active layer 203 into the n-type $Al_xGa_yAs$ first cladding layer 202 does not occur because Si atoms reside in the n-type $Al_xGa_yAs$ first cladding layer 202 as described above.

Therefore, Zn atoms of II group are diffused into the MQW active layer by the first annealing prior to forming the $Si_xO_y$ film 216 of a dielectric film in the vicinity of the laser resonator end surface, diffusion of Zn atoms from the MQW active layer 203 into the n-type $Al_xGa_yAs$ first cladding layer 202 is constrained because of Si in the n-type $Al_xGa_yAs$ first cladding layer 202, and the distribution of Zn atoms within the MQW active layer 203 is uniformed by the second annealing.

Characteristics of the semiconductor laser device obtained by the manufacturing method according to the second embodiment were measured. The characteristics of the semiconductor laser device include emission wavelengths, driving currents and life times thereof.

For comparison, the above characteristics of the semiconductor laser device were also measured in the case that annealing for diffusing Zn atoms into the MQW active layer was conducted after forming the $Si_xO_y$ film 216 in the vicinity of the laser resonator end surface.

In both cases of the present second embodiment and the comparison thereof, emission wavelength (λ) and driving current (Iop) of the semiconductor laser device in 120 mW was 785 nm and 150 mA, respectively.

In addition, there was conducted a reliability test of the semiconductor laser devices at 70° C. in 120 mW. As a result, the semiconductor laser device for comparison showed an average life time of approximately 3000 hours, whereas the semiconductor laser device of the present embodiment showed increased an average life time of approximately 4000 hours.

The above result is attributed to that in the present embodiment the first annealing process is conducted prior to forming the $Si_xO_y$ film 216 in the vicinity of the laser resonator end surface so as to diffuse Zn atoms into the MQW active layer, the second annealing process is conducted to uniform distribution of the Zn atoms in the MQW active layer 203 and in the adjacent p-type $Al_xGa_yAs$ second cladding layer 204, and overflow of the carriers from the MQW active layer 203 to the n-type $Al_xGa_yAs$ first cladding layer 202 is constrained because of Si contained in the layer 202. Thereby, crystallinity of the MQW active layer 203 inside the laser resonator is improved.

In the present embodiment, as in the case with the first embodiment, the $Si_xO_y$ (the values of x and y equal 1 or more) film is used as a dielectric film. However, use of either $Si_xO_y$ or $Si_xO_y$ (the values of x, y, and z equal 1 or more) film enables creation of vacancies in the p-type GaAs protecting layer 207 under the dielectric film 216, and enables effective creation of a window region in the active layer in the vicinity of the laser resonator end surface, whose forbidden bandwidth is effectively larger than that of the active layer (active region) inside the laser resonator. This implements the same effect as stated above.

Although Zn atoms are used as II group atoms in the present embodiment, use of either Be or Mg atoms implements the same effect as stated above.

In the present embodiment, the first annealing for diffusing Zn atoms contained in layers 204 to 207 into the MQW active layer 203 is conducted under ambient atmosphere containing As atoms belonging to V group atoms. However, annealing under ambient atmosphere containing N atoms belonging to V group atoms has the same effect as stated above.

In the present embodiment, the first annealing for diffusing Zn atoms is conducted at 700° C. However, an annealing temperature in a range of 600° C. to 750° C. is also effective to constrain diffusion of Zn atoms into the side of the n-type $Al_xGa_yAs$ first cladding layer 202 and to uniform a distribution of Zn atoms in the vicinity of the MQW active layer 203.

Although the present embodiment relates to $Al_xGa_yAs$ based semiconductor lasers, application thereof to $Al_xGa_y$-$In_zP$ (the values of x, y, and z equal 1 or less) based semiconductor lasers implements the same effect.

Third Embodiment

A third embodiment of the present invention is directed to a preferable range of impurity atom density of II group atoms in the MQW active layer 103 of the semiconductor laser device defined in the first embodiment.

According to the first embodiment, there were manufactured eight different kinds of semiconductor laser devices whose densities of Zn atoms in the MQW active layer 103 are $1\times10^{17}$ cm$^{-3}$, $2\times10^{17}$ cm$^{-3}$, $3\times10^{17}$ cm$^{-3}$, $5\times10^{17}$ cm$^{-3}$, $8\times10^{17}$ cm$^{-3}$, $1\times10^{18}$ cm$^{-3}$, $2\times10^{18}$ cm$^{-3}$ and $3\times10^{18}$ cm$^{-3}$, respectively.

Figure 7:
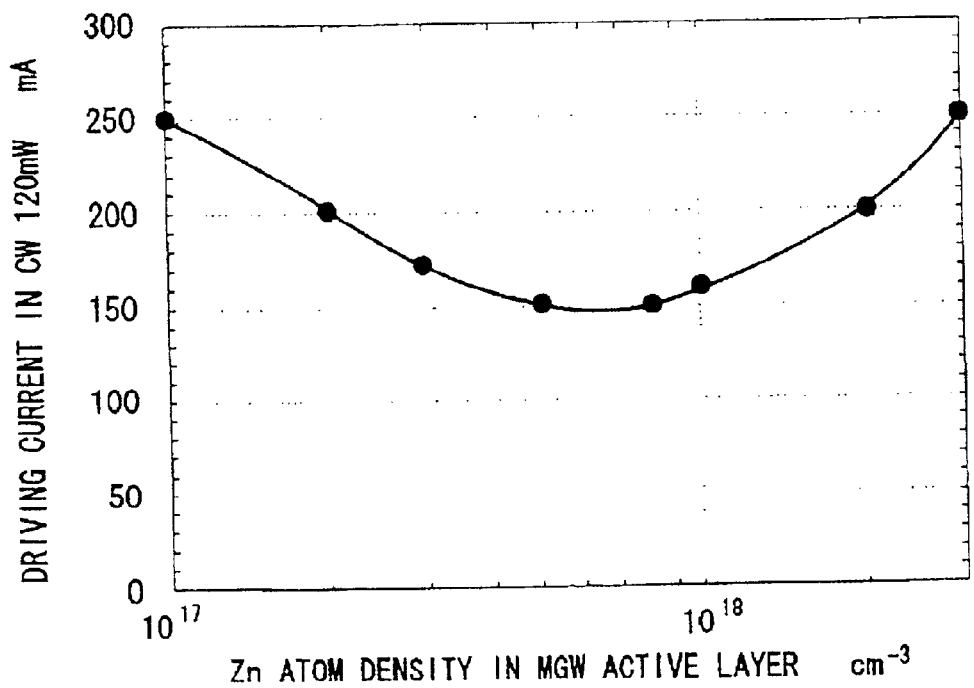
FIG. 7 is a view showing relation between Zn atom density in an MQW active layer and driving current in CW 120 mW.

FIG. 7 shows relation between Zn atom density in the well layer of the MQW active layer and driving current (Iop) in CW 120 mW.

As shown in FIG. 7, the driving current is over 200 mA when the Zn atom density in the well layer of the MQW active layer is $2\times10^{17}$ cm$^{-3}$ or less and $2\times10^{10}$ cm$^{-3}$ or more.

The reason why the driving current becomes over 200 mA when the Zn atom density in the well layer of the MQW active layer is $2\times10^{17}$ cm$^{-3}$ or less is as follows. Annealing by the RTA technique diffuses Zn atoms residing in the layers 104 to 107 into the side of the n-type $Al_xGa_yAs$ first cladding layer 102, which shifts a p-n junction location to the side of the n-type $Al_xGa_yAs$ first cladding layer 102, thereby causing overflow of carriers.

In the case where the Zn atom density is $2\times10^{19}$ cm$^{-3}$ or more, annealing by the RTA technique diffuses Zn atoms residing in the well layer of the MQW active layer 103 into the side of the n-type $Al_xGa_yAs$ first cladding layer 102, which shifts a p-n junction location to the side of the n-type $Al_xGa_yAs$ first cladding layer 102, thereby causing overflow of carriers.

Therefore, in order to have a driving current of 200 mA or less in the semiconductor laser device of the first embodiment, the Zn atom density in the well layer of the MQW active layer needs to be from $2\times10^{17}$ cm$^{-3}$ to $2\times10^{18}$ cm$^{-3}$. More preferably, from the viewpoint of a device yield, it is from $3\times10^{17}$ cm$^{-3}$ to $12\times10^{18}$ cm$^{-3}$. These ranges of Zn atom density prevents the p-n junction location from shifting to the side of the first conductivity type first cladding layer 102 due to diffusion of IT group Zn atoms, and thereby enables constraint of overflow of the carriers from the active layer.

In the present embodiment, though examination was made with use of the method for manufacturing a semiconductor laser device defined in the first embodiment, the same effect can be obtained with use of the method for manufacturing a semiconductor laser device defined in the second embodiment.

Fourth Embodiment

Figure 8A:
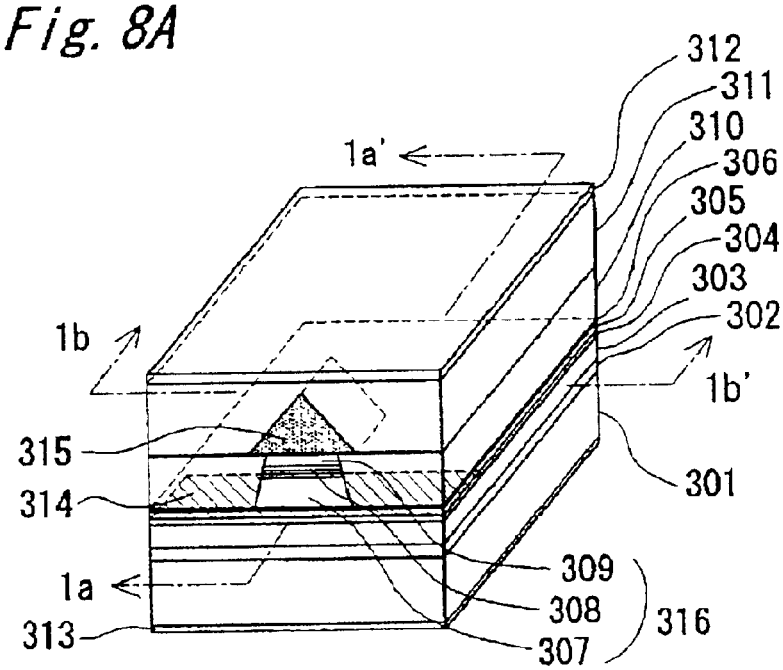
FIGS. 8A to 8C are cross sectional views showing the constitution of a semiconductor laser device according to a fourth embodiment of the present invention.
Figure 8B:
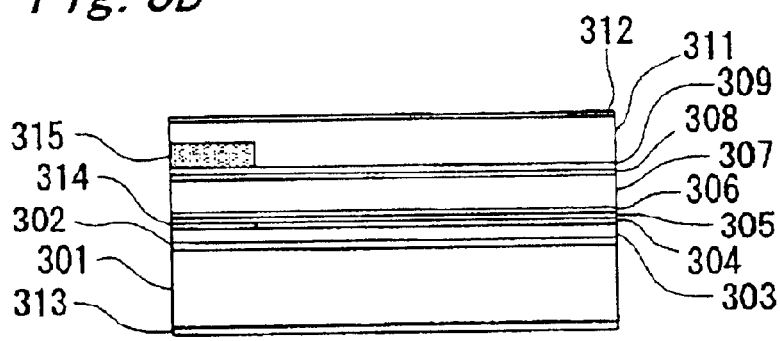
Figure 8C:
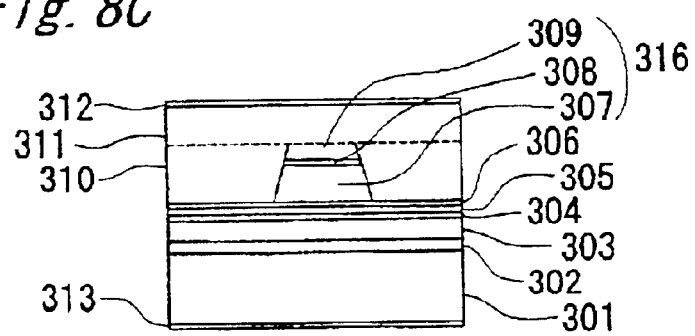

FIGS. 8A to 8C are cross sectional views showing a semiconductor laser device in a fourth embodiment of the present invention. FIG. 8A is a perspective view including a light emitting end surface, FIG. 8B is a cross sectional view taken along a line Ia–Ia' of FIG. 8A showing a wave guide, and FIG. 8C is a cross sectional view in layer thickness direction taken along a line Ib–Ib' of FIG. 8A. In FIGS. 8A to 8C, there are shown: an n-type GaAs substrate 301 inclined 15 degrees in direction of [0 1 1] or [0-1-1]; an n-type $Ga_yIn_zP$ (the values of y and z equal 0 or more and 1 or less: the definition thereof will be omitted hereinafter) buffer layer 302; an n-type $Al_xGa_yIn_zP$ (the values of x, y, and z equal 0 or more and 1 or less: the definition thereof will be omitted hereinafter) first cladding layer 303, an active layer (MQW active layer) 304 composed of a multiquantum well structure having a barrier layer and a well layer laminated each other and light guiding layers interposing the multiquantum well structure therebetween, in which each of the barrier layer, the well layer, and the light guiding layer contains Be atoms which belong to II group atoms; a p-type $Al_xGa_yIn_zP$ second cladding layer 305; a p-type etching stop layer 306; a p-type $Al_xGa_yIn_zP$ third cladding layer 307 composed of a ridge stripe in resonator direction; a p-type $Ga_yIn_zP$ intermediate layer 308; a p-type GaAs protecting layer 309; an n-type $Al_xIn_zP$ (the values of x and y equal 0 or more and 1 or less: the definition thereof will be omitted hereinafter) current blocking layer 310 formed so as to fill the lateral side of the p-type $Al_xGa_yIn_zP$ third cladding layer made up of a ridge stripe; a p-type GaAs contact layer 311; a positive electrode 312; and a negative electrode 313.

In addition, there are shown: a region (window region) 314 where the bandgap energy of the MQW active layer in the vicinity of the laser resonator end surface is larger than the bandgap energy of the MQW active layer 304 inside the laser resonator; a current non-infection area 315 composed of the n-type $Al_xIn_zP$ current blocking layer 310 formed on the p-type GaAs protecting layer 309; and a stripe-shaped ridge 316 composed of the p-type $Al_xGa_yIn_zP$ third cladding layer 307, the p-type $Ga_yIn_zP$ intermediate layer 308, and the p-type GaAs protecting layer 309.

Description will now be given of a manufacturing method with reference to FIG. 9. On an n-type GaAs substrate 301 inclined 15 degrees in direction of [0 1 1] or [0-1-1] (carrier density of $2\times10^{18}$ cm$^{-3}$), there are epitaxially grown an n-type $Ga_yIn_zP$ buffer layer 302 (carrier density of $1\times10^{18}$ cm$^{-3}$), an n-type $Al_xGa_yIn_zP$ first cladding layer 303 (carrier density of $1\times10^{18}$ cm$^{-3}$), an MQW active layer 304 containing Be atoms which belong to II group atoms (Be atom density of $5\times10^{17}$ cm$^{-3}$), a p-type $Al_xGa_yIn_zP$ second cladding layer 305 (carrier density of $1\times10^{18}$ cm$^{-3}$), a p-type etching stop layer 306, a p-type $Al_xGa_yIn_zP$ third cladding layer 307 (carrier density of $1\times10^{18}$ cm$^{-3}$), a p-type $Ga_yIn_zP$ intermediate layer 308, and a p-type Gas protecting layer 309 (carrier density of $7\times10^{18}$ cm$^{-3}$) in sequence by Molecular Beam Epitaxy (MBE) technique (FIG. 9A). Here, each of the layers 301 to 303 contains Si atoms, and each of the layers 304 to 309 contains Be atoms which belong to II group atoms.

With use of a part of a wafer immediately after the process of epitaxial growth, a peak wavelength of the MQW active layer 304 was measured by the PL technique, and the result thereof was 640 nm.

For comparison, with use of a part of a wafer immediately after the process of epitaxial growth which wafer is made according to the conventional manufacturing method of semiconductor laser devices, in which the MQW active layer 304 was not doped with II group atoms in the process of epitaxial growth, a peak wavelength of the MQW active layer 304 thereof was measured by the PL technique. As a result, the wavelength thereof was 640 nm. This makes it clear that doping the MQW active layer 304 with II group atoms in the process of epitaxial growth will not affect the peak wavelength of the MQW active layer 304.

Next, with use of a known photolithographic technique, on the surface of the p-type GaAs protecting layer 309 inside the laser resonator, there is formed a stripe-shaped resist mask with a width of 760 µm in direction orthogonal to the ridge stripe as a protective coating 317. The protective coating 317 is formed so that the p-type GaAs protecting layer 309 inside the laser resonator S not irradiated with ionized atoms. A pitch of the stripe is 800 µm which is equal to a length of the resonator (FIG. 9B).

After that, the p-type GaAs protecting layer 309 in the vicinity of the laser resonator end surface is irradiated with ionized atoms (ion irradiation). In the present embodiment, ion irradiation is conducted with use of nitrogen (N) ions with ion irradiation energy of 150 keV.

Next, the protective coating 317 is removed and annealing is conducted. This makes the bandgap energy of the MQW active layer (window region) 314 in the vicinity of the laser resonator end surface irradiated with ions larger than the bandgap energy of the MQW active (active region) layer 304 inside the laser resonator. Annealing is conducted at a temperature of 700° C. for a retention time of 2 hours under an ambient atmosphere containing As atoms which belong to V group atoms.

With use of a part of a wafer after the annealing, a peak wavelength of the MQW active layer (window region) 314 in the vicinity of the laser resonator end surface irradiated with ions and a peak wavelength of the MQW active layer (active region) 304 inside the laser resonator were measured by the PL technique. As a result, the peak wavelength of the window region 314 was 610 nm and the peak wavelength of the active region 304 was 640 nm. It indicates that the peak wavelength of an emission spectrum from the window region 314 shifts by 30 nm to a short wavelength side compared to the peak wavelength of the emission spectrum from the active region 304. Also, the peak wavelength of the photo-luminescence of the active region 304 after annealing is equal to the peak wavelength of the photo-luminescence immediately after the epitaxial growth.

The above description proves that there is implemented the semiconductor laser device in which the bandgap of the active layer in the vicinity of the laser resonator end surface is larger than the bandgap of the active layer inside the laser resonator, and the fluctuation of the bandgap of the active layer inside the laser resonator is restrained.

In the manufacturing method of the present embodiment, ion irradiation creates vacancies on the surface of the p-type GaAs protecting layer 309, and annealing diffuses the vacancies in direction of the n-type GaAs substrate 301, thereby disordering the MQW active layer. As a result, the MQW active layer 314 right under the region irradiated with ions has increased bandgap energy, which creates a window region whose forbidden bandwidth is effectively larger than that of the MQW active layer (active region) 304 inside the resonator.

In addition, in the manufacturing method of the present embodiment, the MQW active layer 304 is doped with II group atoms in the process of epitaxial growth. Consequently, when vacancies are created inside the laser resonator in the process of the epitaxial growth and annealing and the vacancies are diffused into the MQW active layer, the II group atoms residing all over the MQW active layer 103 complement the vacancies. This makes it possible to restrain the MQW active layer from being disordered, thereby suppressing the fluctuation of the bandgap of the MQW active layer inside the laser resonator.

Next, there is formed a stripe-shaped resist mask 318 extending in direction of [0 1 1] or [0-1-1] on the p-type GaAs protecting layer 309 with use of a known photolithographic technique. Further, with use of a known etching technique, the p-type GaAs protecting layer 309, the p-type $Ga_yIn_zP$ intermediate layer 308 and the p-type $Al_xGa_yIn_zP$ third cladding layer 307 are processed to reach the p-type etching stop layer 306 so as to be a stripe-shaped ridge 316 with a width of approximately 3 µm extending in direction of [0 1 1] or [0-1-1] (FIG. 9C).

Then, the stripe-shaped resist mask 318 formed on the p-type GaAs protecting layer 309 is removed. By the second MBE, the lateral sides of the ridge 316 are filled with an n-type $Al_xIn_zP$ current blocking layer 310, the ridge 316 being composed of the p-type $Al_xGa_yIn_zP$ third cladding layer 307, the p-type $Ga_yIn_zP$ intermediate layer 308 and the p-type GaAs protecting layer 309 (FIG. 9D).

Next, with use of a known photolithographic technique, a resist mask 319 is formed not only on the n-type $Al_xIn_zP$ current blocking layer 310 formed on the lateral sides of the ridge 316 but also on the stripe-shaped n-type $Al_xIn_zP$ current blocking layer 310 with a width of 40 µm formed on the ridge 316 in the vicinity of the laser resonator end surface. With use of a known etching technique, the n-type $Al_xIn_zP$ current blocking layer 310 in an opening of the resist mask 319 is selectively removed (FIG. 9E).

Because the process of removing the n-type $Al_xIn_zP$ current blocking layer 310 formed on the ridge 316 functions also as the process of forming the current non-injection area 315, the number of processes may be reduced. Furthermore, because the current non-injection area 315 is located right above the window region 314, current injection into the window rejoin is prevented. Thereby, carrier loss due to the existence of vacancy defect in the window region is restrained, which makes it possible to reduce ineffective current not contributing to light emission.

After that, the resist mask 319 formed on the n-type $Al_xIn_zP$ current blocking layer 310 is removed, and a p-type GaAs contact layer 311 is formed by third MOCVD (FIG. 9F). Further there are formed a positive electrode 312 on the top surface, and a negative electrode 313 on the bottom surface.

After that, a scribe line is provided to the approximate center of the region in the vicinity of the laser resonator end surface with a width of 40 µm. and the wafer is divided into bars in length direction of the resonator. Finally, the light emitting end surface on both sides of a bar is provided with a reflection coating, and the bar is further divided into chips. Thus, there is manufactured a device having a window region and a current non-injection region with a length of approximately 20 µm on the laser resonator end surface of the resonator with a length of 800 µm.

There was conducted measurement of characteristics including emission wavelengths and driving currents of the semiconductor laser device obtained by the manufacturing method of the present embodiment.

For comparison, there was also conducted measurement of characteristics of the semiconductor laser device according to the conventional manufacturing method in which the MQW active layer 304 was not doped with II group atoms in the process of epitaxial growth.

The results of the measurement showed that an emission wavelength (λ) of the semiconductor laser device of the present embodiment in the case of CW 50 mW was 660 nm, while an emission wavelength (λ) of the conventional semiconductor laser device in the case of CW 50 mW was 655 nm. A driving current (Iop) of the semiconductor laser device of the present embodiment in the case of CW 50 mW was 110 mA, while a driving current (Iop) of the conventional semiconductor laser device in the case of CW 50 mW was 130 mA. These measurement results prove that the method for manufacturing the semiconductor laser device according to the present embodiment enables constraint of the emission wavelength from being shortened, and enables reduction of the driving current.

The constraint of the wavelength from being shortened is implemented by decreased diffusion of vacancies into the MQW active layer 304 inside the laser resonator. The reduction of the driving current is implemented by suppression of increase in density of Be atoms belonging to II group atoms in the MQW active layer 304 as well as by constrained diffusion of the Be atoms into the n-type $Al_xGa_yIn_zP$ first cladding layer 303 inside the laser resonator, which in turn suppresses overflow of carriers from the MQW active layer.

Although Be atoms are used as II group atoms in the present embodiment, either Mg or Zn atoms have the same effect as stated above.

Although the impurity atom density in the well layer of the MQW active layer 304 containing II group atoms is $5 \times 10^{17}$ cm$^{-3}$ in the present embodiment, the density range from $3 \times 10^{17}$ cm$^{-3}$ to $1 \times 10^{18}$ cm$^{-3}$ implements the same effect as stated above.

In the present embodiment, the p-type GaAs protecting layer 309 in the vicinity of the laser resonator end surface is irradiated with N ions. However, any one kind or plural kinds of nitrogen (N) ions, oxygen (O) ions and argon (Ar) ions may be irradiated to form a window region in the active layer in the vicinity of the laser resonator end surface, whose forbidden bandwidth is effectively larger than that of the active layer (active region) inside the laser resonator. They have the same effect as stated above.

Although annealing is conducted under ambient atmosphere containing As atoms which belong to V group atoms in the present embodiment, annealing under ambient atmosphere containing N atoms belonging to V group atoms implements the same effect as stated above. Although annealing is conducted at 700° C. in the present embodiment, an annealing temperature of 600° C. or more and 750° C. or less makes it possible to constrain diffusion of Be atoms belonging to II group atoms into the side of the n-type $Al_xGa_yIn_zP$ first cladding layer 303, resulting in implementation of the same effect as stated above.

Fifth Embodiment

Description will be given of a manufacturing method according to a fifth embodiment of the present invention with reference to FIG. 10. On an n-type GaAs substrate 401 inclined 15 degrees in direction of [0 1 1] or [0-1-1] (carrier density of $2 \times 10^{18}$ cm$^{-3}$), there are epitaxially grown an n-type $Ga_yIn_zP$ (the values of y and z equal 0 or more and 1 or less: the definition thereof will be omitted hereinafter) buffer layer 402 (carrier density of $1 \times 10^{18}$ cm$^{-3}$), an n-type $Al_xGa_yIn_zP$ (the values of x, y and z equal 0 or more and 1 or less: the definition thereof will be omitted hereinafter) first cladding layer 403 (carrier density of $1 \times 10^{18}$ cm$^{-3}$), an MQW active layer 420, a p-type $Al_xGa_yIn_zP$ second cladding layer 405 (carrier density of $1 \times 10^{18}$ cm$^{-3}$), a p-type etching stop layer 406, a p-type $Al_xGa_yIn_zP$ third cladding layer 407 (carrier density of $1 \times 10^{18}$ cm$^{-3}$), a p-type $Ga_yIn_zP$ intermediate layer 408, and a p-type GaAs protecting layer 409 (carrier density of $7 \times 10^{18}$ cm$^{-3}$) in sequence by Molecular Beam Epitaxy (MBE) technique (FIG. 10A). Here, each of the layers 401 to 403 contains Si atoms, and each of the layers 405 to 409 contains Be atoms which belong to II group atoms, though the MQW active layer 420 does not contain Si atoms nor Be atoms that belong to II group atoms.

Next, first annealing is carried out to diffuse Be atoms, which are II atoms contained in each of the layers 405 to 409 of the above stated wafer, into the MQW active layer 420. Consequently, there is created an MQW active layer 404 which contains Be atoms belonging to II group atoms. Annealing is conducted at a Temperature of 700° C. for a retention time of 2 hours under an ambient atmosphere containing As atoms which belong to V group atoms.

The impurity atom density of a part of a wafer after the first annealing was measured by the SIMS technique. As a result, the Be atom density in the well layer of the MQW active layer 404 was $5 \times 10^{17}$ cm$^{-3}$.

Also, with use of a part of the wafer after the first annealing, a peak wavelength of the MQW active layer 404 was measured by the PL technique, and the result thereof was 640 nm. For comparison, with use of a part of the above wafer immediately after the process of epitaxial growth, a peak wavelength of the MQW active layer 420 was also measured by the PL technique, and the result thereof was 640 mm. This makes it clear that carrying out the annealing wall not affect the wavelength of the MQW active layer.

Next, with use of a known photolithographic technique, on the surface of the p-type GaAs protecting layer 409 inside the laser resonator, there is formed a stripe-shaped resist mask with a width of 760 μm in direction orthogonal to the ridge stripe as a protective coating 417. The protective coating 417 is formed so that the p-type GaAs protecting layer 409 inside the laser resonator is not irradiated with ionized atoms. A pitch of the stripe is 800 μm which is equal to a length of the resonator (FIG. 10C).

After that, the p-type GaAs protecting layer 409 in the vicinity of the laser resonator end surface is irradiated with ionized atoms (ion irradiation). In the present embodiment, ion irradiation is conducted with use of argon (AR) ions with ion irradiation energy of 10 keV.

Next, the protective coating 417 is removed and second annealing by the RTA technique is conducted. This makes the bandgap energy of the MQW active layer (window region) 414 in the vicinity of the laser resonator end surface irradiated with ions larger than the bandgap energy of the MQW active layer (active region) 404 inside the laser resonator. Annealing is conducted at a temperature of 950° C., at a temperature increasing rate of 100° C./sec and for a retention time of 60 sec.

With use of a part of a wafer after the second annealing, a peak wavelength of the MQW active layer (window region) 414 in the vicinity of the laser resonator end surface irradiated with ions and a peak wavelength of the MQW active layer (active region) 404 inside the laser resonator were measured by the PL technique. As a result, the peak wavelength of the window region 414 was 600 nm and the peak wavelength of the active region 404 was 640 nm. It indicates that the peak wavelength of an emission spectrum from the window region 414 shifts by 40 nm to a short wavelength side compared to the peak wavelength of the emission spectrum from the active region 404. Also, the peak wavelength of the photo-luminescence of the active region 404 after the second annealing by the RTA technique is equal to the peak wavelength of the photo-luminescence immediately after the first annealing.

The above description proves that there is implemented the semiconductor laser device in which the bandgap of the active layer in the vicinity of the laser resonator end surface is larger than the bandgap of the active layer inside the laser resonator, and the fluctuation of the bandgap of the active layer inside the laser resonator is restrained.

In addition, with use of a par of the wafer after the second annealing by the RTA technique, there is conducted SIMS measurement of a distribution of Be atoms in depth direction inside the laser resonator. As a result, diffusion of the Be atoms into the n-type $Al_xGa_yIn_zP$ first cladding layer 403 was not seen, and there was shown a flat distribution of Be atoms in the region in the vicinity of the MQW active layer 404.

Next, there is formed a stripe-shaped resist mask 418 extending in direction of [0 1 1] or [0-1-1] on the p-type GaAs protecting layer 409 with use of a known photolithographic technique. Further, with use of known etching technique, the p-type GaAs protecting layer 409, the p-type $Ga_yIn_zP$ intermediate layer 408, and the p-type $Al_xGa_yIn_zP$ third cladding layer 407 are processed to be a stripe-shaped ridge 416 with a width of approximately 3 μm extending in direction of [0 1 1] or [0-1-1] so as to reach the p-type etching stop layer 406 (FIG. 10C).

Then, the stripe-shaped resist mask 418 formed on the p-type GaAs protecting layer 409 is removed, and by the second MBE, the lateral side of the ridge 416 composed of the p-type $Al_xGa_yIn_zP$ third cladding layer 407, the p-type $Ga_yIn_zP$ intermediate layer 408, and the p-type GaAs protecting layer 409 is filled with an n-type $Al_xIn_zP$ (the values of x and z equal 0 or more and 1 or less: the definition thereof will be omitted hereinafter) current blocking layer 410 (FIG. 10D).

Next, with use of a known photolithographic technique, there is formed a resist mask 419 on the n-type $Al_xIn_zP$ current blocking layer 410 formed or the lateral side of the ridge 416 and on the stripe-shaped n-type $Al_xIn_zP$ current blocking layer 410 with a width of 40 μm formed on the ridge 416 in the vicinity of the laser resonator end surface. With use of known etching technique, the n-type $Al_xIn_zP$ current blocking layer 410 in an opening of the resist mask 419 is selectively removed (FIG. 10E).

Next, the resist mask 419 formed on the n-type $Al_xIn_zP$ current blocking layer 410 is removed, and a p-type GaAs contact layer 411 is formed by third MBE (FIG. 10F). Further there are formed a positive electrode 412 on the top surface, and a negative electrode 413 on the bottom surface.

After that, a scribe line is provided to the approximate center of the region in the vicinity of the laser resonator end surface with a width of 40 μm, and the wafer is divided into bars in length direction of the resonator. Finally, the light emitting end surface on both sides of a bar is provided with a reflection coating, and the bar is further divided into chips. Thus, there is manufactured a device having a window region and a current non-injection region with a length of approximately 20 μm on the laser resonator end surface of the resonator with a length of 800 μm.

There was conducted measurement of characteristics of the semiconductor laser device obtained by the manufacturing method of the above-stated present embodiment.

For comparison, there was also conducted measurement of characteristics of the semiconductor laser device obtained by the manufacturing method of the above fourth embodiment.

The result indicated that the maximum optical output of the semiconductor laser devices of the present embodiment and the fourth embodiment was free of COD in the optical output as high as 100 mW or more. In addition, there was conducted a reliability test of the above stated semiconductor laser devices at 70° C. in 50 mW. As a result, the semiconductor laser device of the fourth embodiment showed average life of approximately 2000 hours, whereas the semiconductor laser device of the present embodiment showed increased average life of approximately 3000 hours.

The above result is attributed to the first annealing process conducted prior to the process of irradiating the region in the vicinity of the laser resonator end surface with ions, which uniforms a distribution of Be atoms belonging to II group atoms in the region in the vicinity of the active layer, thereby constraining overflow of the carriers from the MQW active layer and improving crystallinity of the MQW active layer inside the laser resonator.

Although Be atoms are used as II group atoms in the present embodiment, use of either Mg or Zn atoms implements the same effect as staled above.

In the present embodiment, the Be atom density in the well layer of the MQW active layer 404 is $5 \times 10^{17}$ cm$^{-3}$ due to the first annealing process for diffusing the Be atoms which are II group atoms contained in the layers 405 to 409. However, the density range from $3 \times 10^{17}$ cm$^{-3}$ to $1 \times 10^{18}$ cm$^{-3}$ implements the same effect as stated above.

In the present embodiment, the p-type GaAs protecting layer 309 in the vicinity of the laser resonator end surface is irradiated with Ar ions. However, ion irradiation with any one or plurality of nitrogen (N) ions, oxygen (O) ions, and argon (AR) ions enables effective creation of a window region in the active layer in the vicinity of the laser resonator end surface, whose forbidden bandwidth is effectively larger than that of the active layer (active region) inside the laser resonator. This implements the same effect as stated above.

In the present embodiment, the first annealing for diffusing Be atoms, which are II group atoms contained in layers 405 to 409, into the MQW active layer is conducted under ambient atmosphere containing As atoms which belong to V group atoms. However, annealing under ambient atmosphere containing N atoms belonging to V group atoms implements the same effect as stated above.

In the present embodiment, the first annealing for diffusing Be atoms, which are II group atoms contained in layers 405 to 409, into the MQW active layer is conducted at 700° C. However, an annealing temperature of 600° C. or more and 750° C. or less makes it possible to constrain diffusion of Be atoms belonging to II group atoms into the side of the n-type $Al_xGa_yIn_zP$ first cladding layer 303, resulting in implementation of the same effect as stated above.

Sixth Embodiment

In a sixth embodiment of the present invention, description will be made of the method for manufacturing the semiconductor laser device as defined in the fourth embodiment, in which a dielectric film is used as a protective coating so that the p-type GaAs protecting layer inside the laser resonator is not irradiated with ionized atoms with reference to FIG. 11.

On an n-type GaAs substrate 501 inclined 15 degrees in direction of [0 1 1] or [0-1-1] (carrier density of $2 \times 10^{18}$ cm$^{-3}$), there are epitaxially grown an n-type $Ga_yIn_zP$ (the values of y and z equal 0 or more and 1 or less: the definition thereof will be omitted hereinafter) buffer layer 502 (carrier density of $1 \times 10^{18}$ cm$^{-3}$), an n-type $Al_xGa_yIn_zP$ (the values of x, y and z equal 0 or more and 1 or less: the definition thereof will be omitted hereinafter) first cladding layer 503 (carrier density of $1\times10^{18}$ cm$^{-3}$), an MQW active layer 504 containing Be atoms which belong to II group atoms (Be atom density of $5\times10^{17}$ cm$^{-3}$), a p-type Al$_x$Ga$_y$In$_z$P second cladding layer 505 (carrier density of $1\times10^{18}$ cm$^{-3}$), a p-type etching stop layer 506, a p-type Al$_x$Ga$_y$In$_z$P third cladding layer 507 (carrier density of $1\times10^{18}$ cm$^{-3}$), a p-type Ga$_y$In$_z$P intermediate layer 508, and a p-type GaAs protecting layer 509 (carrier density of $7\times10^{18}$ cm$^{-3}$) in sequence by the MBE technique (FIG. 10A).

Here, each of the layers 501 to 503 contains Si atoms, and each of the layers 504 to 509 contains Be atoms which belong to II group atoms.

Figure 11A:
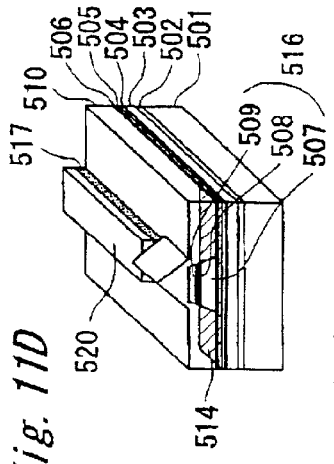
FIGS. 11A to 11F are schematic views showing a method for manufacturing a semiconductor laser device according to a sixth embodiment of the present invention.
Figure 11B:
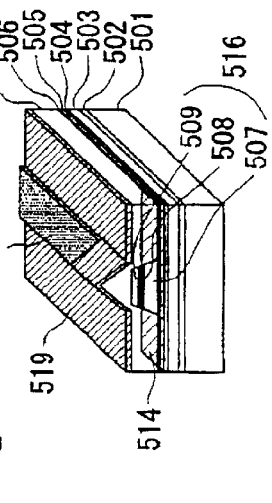

Then, on the surface of the p-type GaAs protecting layer 509 in the vicinity of the laser resonator end surface, there is formed a stripe-shaped Si$_x$O$_y$ (the values of x and y equal 1 or more) film 517 which is a dielectric film with a width of 760 μm in direction orthogonal to the ridge stripe by plasma CVD technique and photolithographic technique. The dielectric film 517 is formed so that the p-type GaAs protecting layer 509 inside the laser resonator is not irradiated with ionized atoms. A pitch of the stripe is 800 μm which is equal to a resonator length (FIG. 11B).

After that, the p-type GaAs protecting layer 509 in the vicinity of the laser resonator end surface is irradiated with ionized atoms (ion irradiation). In the present embodiment, argon (Ar) ions and oxygen (O) ions are irradiated simultaneously, with ion irradiation energy of 10 keV.

Next, annealing is conducted without removing the Si$_x$O$_y$ film 517 which is a dielectric film formed on the p-type GaAs protecting layer 509 inside the laser resonator. This makes the bandgap energy of the MQW active layer (window region) 514 in the vicinity of the laser resonator end surface irradiated with ions larger than the bandgap energy of the MQW active layer (active region) 504 inside the laser resonator. The annealing is conducted at a temperature of 700° C. for a retention time of 2 hours under an ambient atmosphere containing As atoms which belong to V group atoms.

Figure 11C:
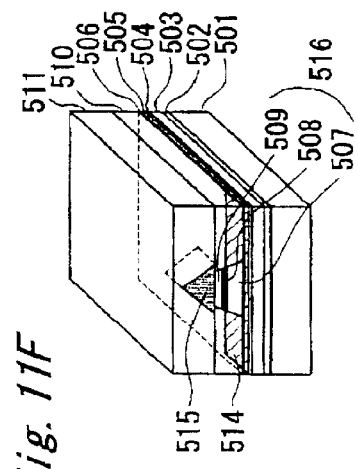

After that, there is formed a stripe-shaped resist mask 518 extending in direction of [0 1 1] or [0-1-1] on the p-type GaAs protecting layer 509 and on the Si$_x$O$_y$ film 517 which is a dielectric film with use of a known photolithographic technique. Further, wish use of known etching technique, the Si$_x$O$_y$ film 517 which is a dielectric film, the p-type GaAs protecting layer 50S, the p-type Ga$_y$In$_z$P intermediate layer 508, and the p-type Al$_x$Ga$_y$In$_z$P third cladding layer 507 are processed to be a stripe-shaped ridge 516 with a width of approximately 3 μm extending in direction of [0 1 1] or [0-1-1] so as to reach the p-type etching stop layer 506 (FIG. 11C)

Figure 11D:
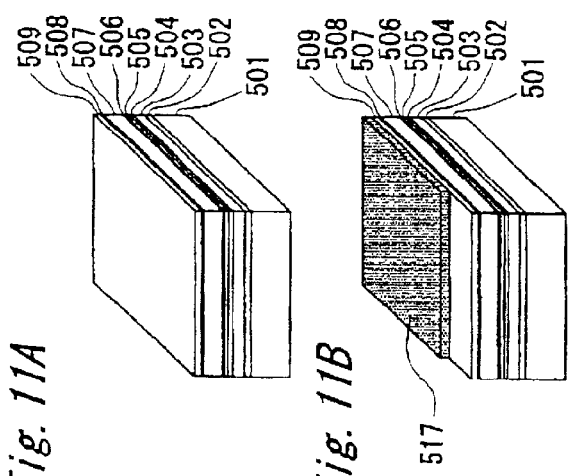

Then, the stripe-shaped resist mask 518 formed on the p-type GaAs protecting layer 509 and on the Si$_x$O$_y$ film 517 is removed, and by the second MBE, the lateral side of the ridge 516 composed of the p-type Al$_x$Ga$_y$In$_z$P third cladding layer 507, the p-type Ga$_y$In$_z$P intermediate layer 508, and the p-type GaAs protecting layer 509 is filled with an n-type Al$_x$In$_z$P (the values of x and z equal 0 or more and 1 or less: the definition thereof will be omitted hereinafter) current blocking layer 510 (FIG. 11D). Here, an Al$_x$In$_z$P polycrystalline 520 is grown on the surface of the Si$_x$O$_y$ film 517 which is a dielectric film.

Figure 11E:
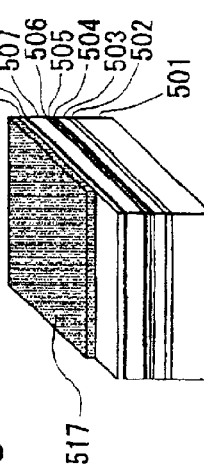

Next, with use of a known photolithographic technique, there is formed a resist mask 519 on the n-type Al$_x$In$_z$P current blocking layer 510 formed on the lateral side of the ridge 516 and on the stripe-shaped n-type Al$_x$In$_z$P current blocking layer 510 with a width of 40 μm formed on the p-type GaAs protecting layer 509 of the ridge 516 in the vicinity of the laser resonator end surface. With use of known etching technique, the Al$_x$In$_z$P polycrystalline 520 in an opening of the resist mask 519 is selectively removed (FIG. 11E)

Because the Al$_x$In$_z$P film to be formed in the opening of the resist mask 519 is formed on the Si$_x$O$_y$ film 517 which is a dielectric film, the film is as the Al$_x$In$_z$P polycrystalline 520 as described above, which may be easily removed by known etching technique. In addition, because the process of selectively removing the Al$_x$In$_z$P polycrystalline 520 in the opening of the resist mask 519 functions also as he process of forming the current non-injection area 515, the number of processes may be reduced. Furthermore, because the current non-injection area 515 formed in the above-stated process is located right above the window region 514, characteristic defect due to dislocation may be decreased.

Figure 11F:
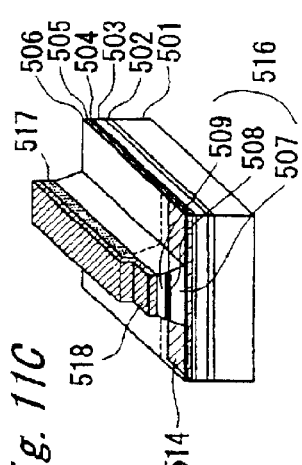
Figure 12A:
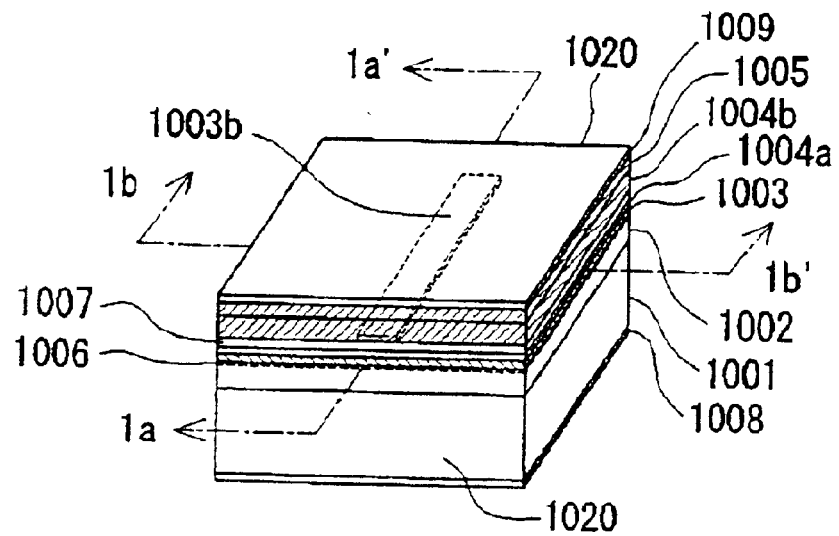
FIGS. 12A to 12C are cross sectional views showing constitution of a prior art semiconductor laser device.
Figure 12B:
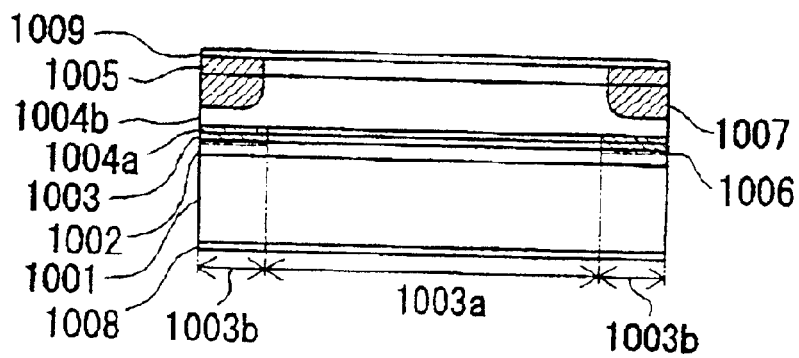
Figure 12C:
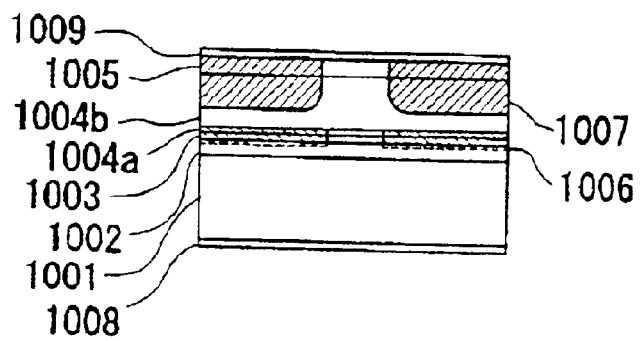
Figure 13A:
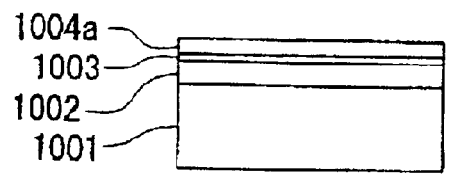
FIGS. 13A to 13D are schematic views showing a method for manufacturing the prior art semiconductor laser device.
Figure 13B:
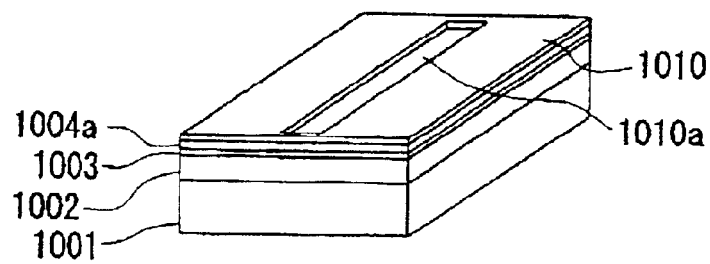
Figure 13C:
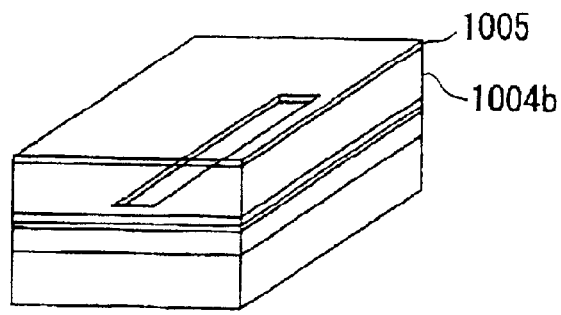
Figure 13D:
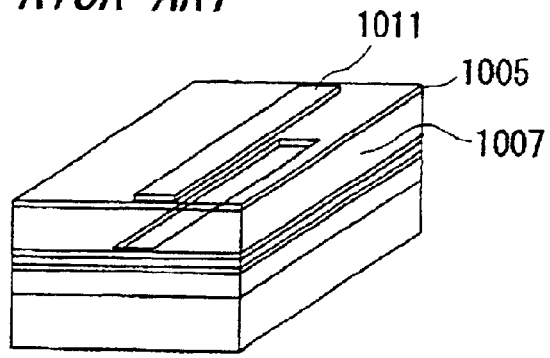

Next, the Si$_x$O$_y$ film 517 which is a dielectric film formed on the p-type Gas protecting layer 509 inside the laser resonator is removed, and thereafter the resist mask 519 formed on the n-type Al$_x$In$_z$P current blocking layer 510 is removed. Then, a p-type GaAs contact layer 511 is formed by third MBE (FIG. 11F). Further there are formed a positive electrode 512 on the top surface, and a negative electrode 513 on the bottom surface.

Next, a scribe line is provided to the approximate center of the region in the vicinity of the laser resonator end surface with a width of 40 μm and the wafer is divided into bars in length direction of the resonator. Finally, the light emitting end surface on both sides of a bar is provided with a reflection coating, and the bar is further divided into chips. Thus, there is manufactured a device having a window region and a current non-injection region with a length of approximately 20 μm on the laser resonator end surface of the resonator with a length of 800 μm.

There was conducted measurement of characteristics of the semiconductor laser device obtained by the manufacturing method of the above-stated present embodiment.

For comparison, there was also conducted measurement of characteristics of the semiconductor laser device obtained by the manufacturing method of the above fourth embodiment.

The result of the measurement showed that an emission wavelength (λ) of the semiconductor laser devices of the present embodiment and the fourth embodiment in the case of CW 50 mW was 660 nm, while a driving current (Vop) of the semiconductor laser device of the present embodiment in the case of CW 50 mW was 2.0 V, and a driving current (Vop) of the semiconductor laser device of the fourth embodiment in the case of CW 50 mw was 2.5 A. This proves that the method for manufacturing the semiconductor laser device according to the present embodiment enables further reduction of the driving current.

Although Be atoms are used as II group atoms in the present embodiment, use of either Mg or Zn atoms implements the same effect as stated above.

In the present embodiment, the Be atom, density in the well layer of the MQW active layer 504 containing II group atoms is $5\times10^{17}$ cm$^{-3}$. However, the density range from $3\times10^{17}$ cm$^{-3}$ to $1\times10^{18}$ cm$^{-3}$ implements the same effect as stated above.

Although the Si$_x$O$_y$ (the values of x and y equal 1 or more) film is used as a dielectric film in the present embodiment, use of either Al$_x$O$_y$, Si$_x$N$_y$, or Si$_x$O$_y$N$_z$ (the values of x, y, and z equal 1 or more) implements the same effect as stated above.

In the present embodiment, the p-type GaAs protecting layer 509 in the vicinity of the laser resonator end surface is irradiated simultaneously with Ar ions and O ions. However, ion irradiation with any one or plurality of nitrogen (N) ions, oxygen (O) ions, and argon (AR) ions enables effective creation of a window region in the active layer in the vicinity of the laser resonator end surface, whose forbidden bandwidth is effectively larger than that of the active layer (active region) inside the laser resonator. This implements the same effect as stated above.

In the present embodiment, annealing is conducted under ambient atmosphere containing As atoms which belong to V group atoms. However, annealing under ambient atmosphere containing N atoms belonging to V group atoms implements the same effect as stated above. In the present embodiment, annealing is conducted at 700° C. However, an annealing temperature of 600° C. or more and 750° C. or less makes it possible to constrain diffusion of Be atoms belonging to II group atoms into the side of the n-type $Al_xGa_yIn_zP$ first cladding layer 503, resulting in implementation of the same effect as stated above.

In the present embodiment, though examination was made on the method for manufacturing a semiconductor laser device defined in the fourth embodiment, the same effect as stated above will be implemented on the method for manufacturing a semiconductor laser device defined in the fifth embodiment.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor laser device having a quantum well active layer including a well layer and a barrier layer laminated on a semiconductor substrate, in which a photoluminescence light from the quantum well active layer in a vicinity of a light emitting end surface is smaller in a peak wavelength than a photoluminescence light from the quantum well active layer in an internal region, wherein
each of the well layer and the barrier layer of the quantum well active layer contains II group atoms.

2. The semiconductor laser device as defined in claim 1, further comprising two cladding layers for interposing the quantum well active layer therebetween, wherein impurity atoms contained in the cladding layers are identical to the II group atoms.

3. The semiconductor laser device as defined in claim 2, wherein Si atoms are contained in a first cladding layer for interposing the quantum well active layer from a side of the semiconductor substrate, of the two cladding layers for interposing the quantum well active layer therebetween.

4. The semiconductor laser device as defined in claim 3, wherein the II group atoms are contained in a second cladding layer for interposing the quantum well active layer from a side opposite to the side of the semiconductor substrate.

5. The semiconductor laser device as defined in claim 2, further comprising:
ridge-shaped stripe geometry extended in a resonance direction and formed on a second cladding layer for interposing the quantum well active layer from a side opposite to a side of the semiconductor substrate, and wherein
a current non-injection area selectively formed in a region in a vicinity of a light emitting end surface on the ridge-shaped stripe geometry.

6. The semiconductor laser device as defined in claim 1, wherein an impurity atom density of the II group atoms contained in the well layer is within a range from $3\times10^{17}$ cm$^{-3}$ to $1\times10^{18}$ cm$^{-3}$.

7. The semiconductor laser device as defined in claim 1, wherein the semiconductor substrate is composed of GaAs, and
a semiconductor layer composed of at least an AlGaAs based material is laminated on the semiconductor substrate.

8. The semiconductor laser device as defined in claim 1, wherein the semiconductor substrate is composed of GaAs, and a semiconductor layer composed of at least an AlGaInP based material is laminated on the semiconductor substrate.

9. The semiconductor laser device as defined in claim 1, wherein the II group atom is any one of a zinc atom, a beryllium atom and a magnesium atom.

10. The semiconductor laser device of claim 1, wherein a bandgap of the quantum well active layer in the vicinity of the light emitting end surface is larger than a bandgap of the quantum well active layer in the internal region.

11. The semiconductor laser device of claim 1, wherein the Group II atoms comprise at least one of zinc atoms, beryllium atoms and magnesium atoms.

12. A method for manufacturing a semiconductor laser device, comprising the steps of:
growing a laminated structure having a first conductivity type cladding layer, a quantum well active layer comprising a well layer and a barrier layer including II group atoms, and a second conductivity type cladding layer on a first conductivity type semiconductor substrate;
selectively forming a dielectric film in a vicinity of a light emitting end surface on the laminated structure; and
making a peak wavelength of a photoluminescence light from the quantum well active layer beneath a region in which the dielectric film is formed smaller than a peak wavelength of a photoluminescence light from the quantum well active layer beneath a region in which the dielectric film is not formed, by annealing.

13. The method for manufacturing a semiconductor laser device as defined in claim 12, wherein the II group atom is any one of a zinc atom, a beryllium atom and a magnesium atom.

14. The method of claim 12, wherein the well layer and/or barrier layer comprises Group II atoms in an amount of from $3\times10^{17}$ cm$^{-3}$ to $1\times10^{18}$ cm$^{-3}$.

15. A method for manufacturing a semiconductor laser device, comprising the steps of:
growing a laminated structure having a first conductivity type cladding layer, a quantum well active layer composed of a well layer and a barrier layer, and a second conductivity type cladding layer including II group atoms on a first conductivity type semiconductor substrate;
diffusing the II group atoms in the second conductivity type cladding layer into the quantum well active layer by first annealing;
selectively forming a dielectric film in a region in a vicinity of a light emitting end surface on the laminated structure; and
making a peak wavelength of a photoluminescence light from the quantum well active layer beneath a region in which the dielectric film is formed smaller than a peak wavelength of a photoluminescence light from the quantum well active layer beneath a region in which the dielectric film is not formed, by second annealing.

16. The method for manufacturing a semiconductor laser device as defined in claim 15, wherein the II group atom is any one of a zinc atom, a beryllium atom and a magnesium atom.

17. A method for manufacturing a semiconductor laser device, comprising the steps of:
grouping a laminated structure having a first conductivity type cladding layer, a quantum well active layer composed of a well layer and a barrier layer including II group atoms, and a second conductivity type cladding layer on a first conductivity type semiconductor substrate;
selectively irradiating a region in a vicinity of a light emitting end surface of the laminated structure with ionized atoms; and
making a peak wavelength of a photoluminescence light from the quantum well active layer beneath a region which is irradiated with the ionized atoms smaller than a peak wavelength of a photoluminescence light from the quantum well active layer beneath a region which is not irradiated with ionized atoms, by annealing.

18. The method for manufacturing a semiconductor laser device as defined in claim 17, wherein a dielectric film is used as a mask when the region in the vicinity of the light emitting end surface of the laminated structure is selectively irradiated with the ionized atoms.

19. The method for manufacturing a semiconductor laser device as defined in claim 17, wherein the ionized atom is at least any one of argon, oxygen and nitrogen.

20. The method for manufacturing a semiconductor laser device as defined in claim 17, wherein the II group atom is any one of a zinc atom, a beryllium atom and a magnesium atom.

21. A method for manufacturing a semiconductor laser device, comprising the steps of:
growing a laminated structure having a first conductivity type cladding layer, a quantum well active layer composed of a well layer and a barrier layer, and a second conductivity type cladding layer including II group atoms on a first conductivity type semiconductor substrate;
diffusing the II group atoms in the second conductivity type cladding layer into the quantum well active layer by first annealing;
selectively irradiating a region in a vicinity of a light emitting end surface of the laminated structure with ionized atoms; and
making a peak wavelength of a photoluminescence light from the quantum well active layer beneath a region which is irradiated with the ionized atoms smaller than a peak wavelength of a photoluminescence light from the quantum well active layer beneath a region which is not irradiated with ionized atoms, by second annealing.

22. The method for manufacturing a semiconductor laser device as defined in claim 21, wherein a dielectric film is used as a mask when the region in the vicinity of the light emitting end surface of the laminated structure is selectively irradiated with the ionized atoms.

23. The method for manufacturing a semiconductor laser device as defined in claim 21, wherein the ionized atom is at least any one of argon, oxygen and nitrogen.

24. The method for manufacturing a semiconductor laser device as defined in claim 21, wherein the II group atom is any one of a zinc atom, a beryllium atom and a magnesium atom.

25. A semiconductor laser device comprising:
a quantum well active layer including a well layer and a barrier layer laminated in any order on a semiconductor substrate,
wherein photoluminescence light from the quantum well active layer in a vicinity of a light emitting end surface is smaller in a peak wavelength than photoluminescence light from the quantum well active layer in an internal or central region thereof, and wherein the well layer and/or barrier layer of the quantum well active layer comprises Group II atoms in an amount of from $3 \times 10^{17}$ cm$^{-3}$ to $1 \times 10^{18}$ cm$^{-3}$.

26. The semiconductor laser device of claim 25, wherein a bandgap of the quantum well active layer in the vicinity of the light emitting end surface is larger than a bandgap of the quantum well active layer in the internal region.

27. The semiconductor laser device of claim 25, wherein the Group II atoms comprise at least one of zinc atoms, beryllium atoms and magnesium atoms.

* * * * *